(12) United States Patent
Kong et al.

(10) Patent No.: US 11,855,053 B2
(45) Date of Patent: Dec. 26, 2023

(54) DISPLAY DEVICE AND METHOD FOR MANUFACTURING SAME

(71) Applicant: SAMSUNG DISPLAY CO., LTD., Yongin-si (KR)

(72) Inventors: Tae Jin Kong, Yongin-si (KR); Myeong Hee Kim, Yongin-si (KR); Hee Keun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 239 days.

(21) Appl. No.: 17/413,324

(22) PCT Filed: Jun. 13, 2019

(86) PCT No.: PCT/KR2019/007162
§ 371 (c)(1),
(2) Date: Jun. 11, 2021

(87) PCT Pub. No.: WO2020/122337
PCT Pub. Date: Jun. 18, 2020

(65) Prior Publication Data
US 2022/0068901 A1 Mar. 3, 2022

(30) Foreign Application Priority Data

Dec. 13, 2018 (KR) .......................... 10-2018-0161079

(51) Int. Cl.
*H01L 25/16* (2023.01)
*H01L 27/12* (2006.01)
*H01L 33/60* (2010.01)

(52) U.S. Cl.
CPC .......... *H01L 25/167* (2013.01); *H01L 27/124* (2013.01); *H01L 27/1248* (2013.01); *H01L 27/1259* (2013.01); *H01L 33/60* (2013.01)

(58) Field of Classification Search
None
See application file for complete search history.

(56) References Cited

U.S. PATENT DOCUMENTS 8,987,765 B2 3/2015 Bibl et al.
9,178,123 B2 11/2015 Sakariya et al.
(Continued)

FOREIGN PATENT DOCUMENTS

EP 3 270 413 1/2018
EP 3 882 974 9/2021
(Continued)

OTHER PUBLICATIONS

International Search Report, with English translation, corresponding to International Application No. PCT/KR2019/007162 dated Sep. 20, 2019.
(Continued)

*Primary Examiner* — Bo B Jang
(74) *Attorney, Agent, or Firm* — KILE PARK REED & HOUTTEMAN PLLC

(57) ABSTRACT

A display device includes a base layer including a display area and a non-display area; and pixels disposed in the display area, each of the pixels including sub-pixels. Each of the sub-pixels includes a pixel circuit layer and a display element layer disposed on the pixel circuit layer. The display element layer includes a partition wall disposed in each of the sub-pixels; a bank disposed between adjacent ones of the sub-pixels; a first electrode and a second electrode disposed on the partition wall and spaced apart from each other; a reflective pattern disposed on the bank; and at least one light emitting element disposed between the first electrode and the second electrode.

20 Claims, 16 Drawing Sheets

(56) References Cited

U.S. PATENT DOCUMENTS

| | | |
|---|---|---|
| 10,461,123 B2 | 10/2019 | Kim et al. |
| 10,651,426 B2 | 5/2020 | Park et al. |
| 10,672,946 B2 | 6/2020 | Cho et al. |
| 10,818,820 B2 | 10/2020 | Kim |
| 2014/0159064 A1* | 6/2014 | Sakariya ............... H01L 25/167 |
| | | 257/88 |
| 2017/0294628 A1 | 10/2017 | Kim et al. |
| 2018/0012876 A1 | 1/2018 | Kim et al. |
| 2018/0019369 A1* | 1/2018 | Cho ........................ H05K 1/11 |

FOREIGN PATENT DOCUMENTS

| | | |
|---|---|---|
| JP | 2007-157404 | 6/2007 |
| KR | 10-2014-0127136 | 11/2014 |
| KR | 10-2017-0079645 | 7/2017 |
| KR | 10-2018-0007376 | 1/2018 |
| KR | 10-2018-0062548 | 6/2018 |
| KR | 10-2018-0072909 | 7/2018 |
| KR | 10-2018-0112925 | 10/2018 |
| KR | 10-2019-0120467 | 10/2019 |
| KR | 10-2019-0124359 | 11/2019 |
| KR | 10-2020-0001649 | 1/2020 |
| KR | 10-2020-0001656 | 1/2020 |

OTHER PUBLICATIONS

Written Opinion, with English translation, corresponding to International Application No. PCT/KR2019/007162, dated Sep. 20, 2019.

* cited by examiner

DISPLAY DEVICE AND METHOD FOR MANUFACTURING SAME

CROSS-REFERENCE TO RELATED APPLICATION(S)

This application is a national entry of International Application No. PCT/KR2019/007162, filed on Jun. 13, 2019, which claims under 35 U.S.C. § 119(a) and 365(b) priority to and benefits of Korean Patent Application No. 10-2018-0161079, filed on Dec. 13, 2018 in the Korean Intellectual Property Office, the entire contents of which are incorporated herein by reference.

TECHNICAL FIELD

Various embodiments relate to a display device, and, to a display device including a subminiature light emitting element and a method of manufacturing the display device.

DESCRIPTION OF THE RELATED ART

A light emitting element may have relatively satisfactory durability even under poor environmental conditions, and have excellent performances in terms of lifetime and luminance. Recently, research on the technology of applying such light emitting elements to various display devices has become appreciably more active.

As a part of such research, technologies of manufacturing an LED having a small size corresponding to a micrometer scale or a nanometer scale using an inorganic crystalline structure, for example, a structure obtained by growing a nitride-based semiconductor are being developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments are directed to a display device having enhanced light efficiency, and a method of manufacturing the display device.

A display device in accordance with an embodiment may include a base layer including a display area and a non-display area; and a plurality of pixels disposed in the display area, each of the plurality of pixels including a plurality of sub-pixels. Each of the plurality of sub-pixels may include a pixel circuit layer; and a display element layer disposed on the pixel circuit layer. The display element layer may include a partition wall disposed in each of the plurality of sub-pixels; a bank disposed between adjacent ones of the plurality of sub-pixels; a first electrode and a second electrode disposed on the partition wall and spaced apart from each other; a reflective pattern disposed on the bank; and at least one light emitting element disposed between the first electrode and the second electrode.

In an embodiment, the reflective pattern may enclose an upper surface and a side surface of the bank.

In an embodiment, the partition wall may be disposed between the bank and the at least one light emitting element.

In an embodiment, the bank and the partition wall may be disposed on a same layer and may include a same material.

In an embodiment, the partition wall and the bank may be disposed on different layers.

In an embodiment, the first electrode, the second electrode, and the reflective pattern may be disposed on a same layer, and the first electrode and the second electrode may include a same material.

In an embodiment, the first electrode and the second electrode may be disposed on a different layer from a layer on which the reflective pattern is disposed.

In an embodiment, the pixel circuit layer may include at least one transistor disposed on the base layer; and a passivation layer disposed on the at least one transistor.

In an embodiment, the passivation layer, the partition wall, and the bank may be integral with each other.

In an embodiment, each of the plurality of sub-pixels may include a light conversion pattern layer disposed in a space formed by the bank and the light conversion pattern layer may include color conversion particles that convert a light into a color of light.

In an embodiment, the display device may further include a capping layer disposed on the light conversion pattern layer and overlapping the display area.

In an embodiment, the light conversion pattern layer may include a color filter.

A method of manufacturing a display device in accordance with an embodiment may include providing a base layer including a plurality of sub-pixels; forming a pixel circuit layer on the base layer; and forming a display element layer on the pixel circuit layer. Forming of the display element layer may include forming a partition wall in each of the plurality of sub-pixels; forming a bank between adjacent ones of the plurality of sub-pixels; forming a first electrode and a second electrode spaced apart from each other and disposed on the partition wall; forming a reflective pattern on the bank; and forming at least one light emitting element disposed between the first electrode and the second electrode.

In an embodiment, the forming of the reflective pattern may include enclosing an upper surface and a side surface of the bank with the reflective pattern.

In an embodiment, the partition wall and the bank may be formed on a same layer through a same process.

In an embodiment, the partition wall and the bank may be formed on different layers through different processes.

In an embodiment, the first electrode, the second electrode, and the reflective pattern may be formed on a same layer through a same process.

In an embodiment, the first electrode and the second electrode may be formed on a different layer from a layer of the reflective pattern, and the first electrode and the second electrode may be formed through a different process from a process of forming the reflective pattern.

In an embodiment, the forming of the at least one light emitting element may include aligning the at least one light emitting element between the first electrode and the second electrode by applying alignment voltages to the first electrode and the second electrode, respectively.

In an embodiment, the method may further include forming a light conversion pattern layer in a space formed by the bank in each of the plurality of sub-pixels, the light conversion pattern layer including color conversion particles converting a light to a color of light.

A display device and a method of manufacturing the display device in accordance with the disclosure may have the following effects.

Light emitted from a light emitting element may be reflected toward a capping layer through a reflective pattern disposed on a bank. Hence, the light efficiency may be enhanced.

A pixel circuit layer, a display element layer, and a light conversion pattern layer may all be disposed on the base layer. Therefore, a light path along which light emitted from the light emitting element is emitted to the outside through a capping layer is reduced, so that light loss may be minimized.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
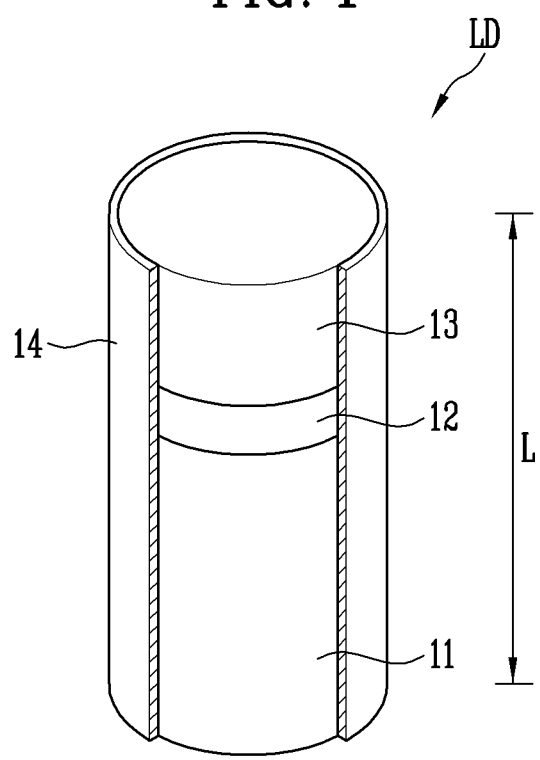
FIG. 1 is a perspective view illustrating a light emitting element in accordance with an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Like components will be designated by like reference symbols. Furthermore, it should be noted that the drawings may be exaggerated in thickness, ratio, and dimension of components for descriptive convenience and clarity only. The term "and/or" may include any and all combinations of one or more of the associated listed items.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

Also, the terms "under", "below", "above", "upper", and the like are used herein for explaining a relationship between one component or relationships among or more components illustrated in the drawings. These terms may be relative terms describing the positions of components in the drawings, but the positions of the components are not limited thereto.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprise", "include", "have", and variations thereof when used in this specification, specify the presence of stated features, integers, steps, operations, elements, components, and/or combinations of them but do not preclude the presence or addition of one or more other features, integers, steps, operations, elements, components, and/or combinations thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a light emitting element in accordance with an embodiment.

As illustrated in FIG. 1, a light emitting element LD in accordance with an embodiment may include a first conductive semiconductor layer 11, a second conductive semiconductor layer 13, and an active layer 12 interposed between the first conductive semiconductor layer 11 and the second conductive semiconductor layer 13.

For example, the light emitting element LD may have a structure formed by successively stacking the first conductive semiconductor layer 11, the active layer 12, and the second conductive semiconductor layer 13. The light emitting element LD may be provided in a substantially rod shape extending in one or a direction. Here, the words "rod shape" may embrace a rod-like shape or a bar-like shape extending in a longitudinal direction (L) (for example, having an aspect ratio greater than 1).

The light emitting element LD may have a substantially rod shape formed by successively stacking the first conductive semiconductor layer 11, the active layer 12, and the second conductive semiconductor layer 13 in the longitudinal direction (L) of the light emitting element LD, and have a first end and a second end based on the active layer 12. One of the first and second conductive semiconductor layers 11 and 13 may be disposed on the first end of the light emitting element LD, and the other of the first and second conductive semiconductor layers 11 and 13 may be disposed on the second end of the light emitting element LD.

The light emitting element LD may be manufactured in a small size having a diameter and/or length corresponding to, for example, a micro-scale or nano-scale size. However, the size of the light emitting element LD in accordance with an embodiment is not limited to this, and the size of the light emitting element LD may be changed to satisfy requirements for the display device to which the light emitting element LD may be applied.

The first conductive semiconductor layer 11 may include, for example, at least one n-type semiconductor layer. For instance, the first conductive semiconductor layer 11 may include a semiconductor layer which may include any one semiconductor material of InAlGaN, GaN, AlGaN, InGaN, AlN, and InN, and doped with a first conductive dopant such as Si, Ge, or Sn. The material forming the first conductive semiconductor layer 11 is not limited to this, and the first conductive semiconductor layer 11 may be formed of various other materials.

The active layer 12 may be formed or disposed on the first conductive semiconductor layer 11 and have a single or multiple quantum well structure. In accordance with an embodiment, a cladding layer (not shown) doped with a conductive dopant may be formed or disposed on and/or under or below the active layer 12. For example, the cladding layer may be formed of an AlGaN layer or an InAlGaN layer. Material such as AlGaN or AlInGaN may be employed to form the active layer 12.

If an electric field having a predetermined voltage or more is applied to the opposite ends of the light emitting element LD, the light emitting element LD emits light by coupling of electron-hole pairs in the active layer 12.

The second conductive semiconductor layer 13 may be provided or disposed on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include a semiconductor layer which may include any one semiconductor material of InAlGaN, GaN, AlGaN, InGaN, AlN, and InN, and doped with a second conductive dopant such as Mg. The material forming the second conductive semiconductor layer 13 is not limited to this, and the second conductive semiconductor layer 13 may be formed of various other materials.

In accordance with an embodiment, the light emitting element LD may not only include the first conductive semiconductor layer 11, the active layer 12, and the second conductive semiconductor layer 13, but may also include a fluorescent layer, another active layer, another semiconductor layer, and/or an electrode layer provided or disposed on and/or under or below each layer. For example, the light emitting element LD may include an electrode layer disposed on the second conductive semiconductor layer 13.

The light emitting element LD may further include an insulating film 14. In an embodiment, the insulating film 14 may be omitted, or may be provided or disposed to cover or overlap only some or a number of the first conductive semiconductor layer 11, the active layer 12, and the second conductive semiconductor layer 13.

For example, the insulating film 14 may be provided or disposed on a portion of the light emitting element LD, other than the opposite ends thereof, so that the opposite ends of the light emitting element LD may be exposed. Although in FIG. 1 there is illustrated the insulating film 14 from which a portion thereof has been removed for the sake of explanation, the light emitting element LD may be formed such that the entirety of the side surface of the cylindrical body thereof is enclosed by the insulating film 14.

The insulating film 14 may be provided or disposed to enclose at least a portion of an outer circumferential surface of the first conductive semiconductor layer 11, the active layer 12, and/or the second conductive semiconductor layer

13. For example, the insulating film 14 may be provided or disposed to enclose at least the outer circumferential surface of the active layer 12.

In accordance with an embodiment, the insulating film 14 may include a transparent insulating material. For example, the insulating film 14 may include at least one insulating material selected from the group consisting of $SiO_2$, $Si_3N_4$, $Al_2O_3$, and $TiO_2$, but the disclosure is not limited thereto. In other words, various materials having insulating properties may be employed.

If the insulating film 14 is provided or disposed on the light emitting element LD, the active layer 12 may be prevented from short-circuiting with a first and/or second electrode (not illustrated).

Because of the insulating layer 14, an occurrence of a defect on the surface of the light emitting element LD may be minimized, whereby the lifetime and efficiency of the light emitting element LD may be improved. Where a plurality of light emitting elements LD are disposed in close contact with each other, the insulating layer 14 may prevent an undesired short-circuit from occurring between adjacent light emitting elements LD.

The light emitting element LD may be employed as a light source for various display devices. For example, the light emitting element LD may be used in a lighting device or a self-emissive display device.

Hereinafter, the display device including the light emitting element LD in accordance with an embodiment will be described in detail.

Figure 2:
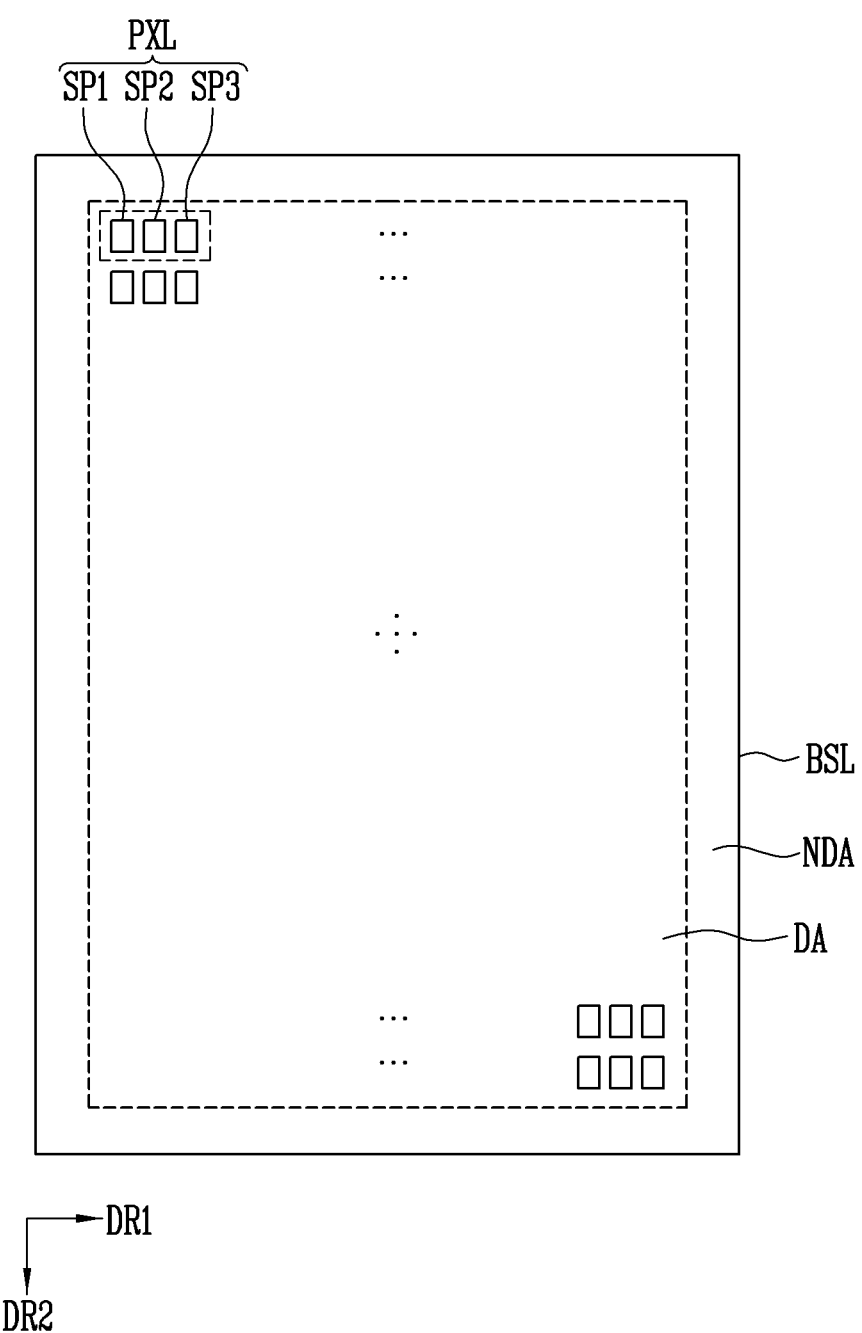
FIG. 2 illustrates a display device in accordance with an embodiment, and is a schematic plan view illustrating a display device using the light emitting element illustrated in FIG. 1 as a light emitting source.

FIG. 2 illustrates a display device in accordance with an embodiment, and is a schematic plan view illustrating a display device using the light emitting element illustrated in FIG. 1 as a light emitting source.

For the sake of explanation, FIG. 2 schematically illustrates the structure of the display device, focused on a display area DA on which an image is displayed. In an embodiment, although not illustrated, at least one driving circuit (for example, a scan driver and a data driver) and/or a plurality of signal lines may be further provided or disposed in the display device.

Referring to FIGS. 1 and 2, the display device in accordance with an embodiment may include a base layer BSL, a plurality of pixels PXL provided or disposed on the base layer BSL and each including at least one light emitting element LD, a driver (not illustrated) provided or disposed on the base layer BSL to drive the pixels PXL, and a line component (not illustrated) provided to electrically connect or couple the pixels PXL with the driver.

The display device may be classified into a passive-matrix type display device and an active-matrix type display device according to a method of driving the light emitting element LD. Where the display device is implemented as an active matrix type, each of the pixels PXL may include a driving transistor to control the amount of current supplied to the light emitting element LD, and a switching transistor to transmit data signals to the driving transistor.

Recently, active-matrix type display devices selectively turning on each pixel PXL taking into account the resolution, the contrast, and the working speed have been mainstreamed. However, the disclosure is not limited thereto. For example, passive-matrix type display devices in which pixels PXL may be turned on by groups may also employ components (for example, first and second electrodes) for driving the light emitting element LD.

The base layer BSL may be a substrate of the display device, and include a display area DA and a non-display area NDA. The display area DA may be an area in which the pixels PXL for displaying an image are provided or disposed. The non-display area NDA may be an area in which the driver for driving the pixels PXL and some or a portion of the line component for electrically connecting or coupling the pixels PXL to the driver may be provided or disposed.

Although there is illustrated an example where the display area DA is disposed in a central area of the display device and the non-display area NDA is disposed in a perimeter area of or adjacent to the display device to enclose the display area DA, the disclosure is not limited thereto, and the locations thereof may be changed.

The display area DA may have various shapes. For example, the display area DA may be provided in various forms such as a substantially closed polygon including sides formed of linear lines, a circle, an ellipse or the like including a side formed of a substantially curved line, and a semicircle, a semi-ellipse or the like including sides formed of a substantially linear line and a substantially curved line. The non-display area NDA may be provided or disposed on at least one or a side of the display area DA. Although in the drawing there is illustrated a structure in which the non-display area NDA encloses the display area DA, the disclosure is not limited thereto.

The base layer BSL may be a rigid substrate or a flexible substrate, and the disclosure is not limited thereto. For example, the base layer BSL may be a rigid substrate made of glass or reinforced glass, or a flexible substrate formed of a thin film made of plastic or metal. Furthermore, the base layer BSL may be a transparent substrate, but it is not limited thereto. The base layer BSL may be a translucent substrate, an opaque substrate, or a reflective substrate.

The pixels PXL may be provided or disposed in the display area DA on the base layer BSL. Each of the pixels PXL refers to a smallest unit for displaying an image, and a plurality of pixels may be provided or disposed.

Each of the pixels PXL may include a light emitting element LD to be driven in response to a scan signal and a data signal. The light emitting element LD may have a small size corresponding to the nanometer scale or the micrometer scale, and may be electrically connected or coupled in parallel to light emitting elements LD disposed adjacent thereto. The light emitting element LD may form a light source of the corresponding pixel PXL.

Furthermore, each of the pixels PXL may include a plurality of sub-pixels SP1, SP2, and SP3. For example, each pixel PXL may include a first sub-pixel SP1, a second sub-pixel SP2, and a third sub-pixel SP3 that emit different colors of light. For instance, the first sub-pixel SP1 may be a red sub-pixel to emit red light, the second sub-pixel SP2 may be a green sub-pixel to emit green light, and the third sub-pixel SP3 may be a blue sub-pixel to emit blue light. However, the color, type, and/or number of sub-pixels that form each pixel PXL are not limited to the foregoing examples.

Although FIG. 2 illustrates that the pixels PXL are disposed in the display area DA in the form of a matrix in a first direction DR1 and a second direction DR2 different from the first direction DR1, the disposition of the pixels PXL may be changed in various ways without being limited to the foregoing example. Furthermore, the disposition of the plurality of sub-pixels of each of the pixels PXL may also be changed in various ways.

The driver may provide a driving signal to each pixel PXL through the line component and thus control the operation of the pixel PXL. In FIG. 2, the line component is omitted for the convenience of explanation.

The driver may include a scan driver to provide scan signals to the pixels PXL through scan lines, an emission driver to provide emission control signals to the pixels PXL through emission control lines, a data driver to provide data signals to the pixels PXL through data lines, and a timing controller. The timing controller may control the scan driver, the emission driver, and the data driver.

FIGS. 3A to 3D are equivalent circuit diagrams illustrating examples of a unit light emitting area of the display device of FIG. 2 in accordance with various embodiments.

Referring to FIGS. 3A to 3D, each of the first to third sub-pixels may be an active pixel. However, the type, the structure, and/or the driving method of each of the first to third sub-pixels is not particularly limited. For example, each of the first to third sub-pixels may be a pixel of a passive or active display device which can have various structures.

Furthermore, referring to FIGS. 3A to 3D, the first to third sub-pixels may have substantially the same structure or similar structures. Hereinafter, for convenience sake, the first sub-pixel of the first to third sub-pixels will be described as a representative example.

Figure 3A:
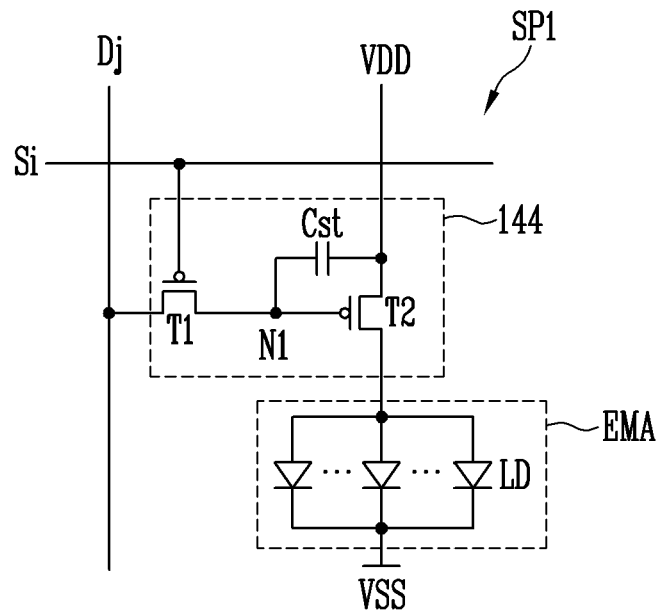
FIGS. 3A to 3D are equivalent circuit diagrams illustrating examples of a unit light emitting area of the display device of FIG. 2 in accordance with various embodiments.

Referring to FIGS. 1, 2, and 3A, the first sub-pixel SP1 may include an emission area EMA to generate light having a luminance corresponding to a data signal, and a pixel driving circuit 144 to drive the emission area EMA.

In an embodiment, the emission area EMA may include a plurality of light emitting elements LD electrically connected or coupled in parallel to each other between a first driving power supply VDD and a second driving power supply VSS. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a threshold voltage of the light emitting elements LD or more during an emission period of the first sub-pixel SP1.

A first electrode (for example, an anode electrode) of each of the light emitting elements LD may be electrically connected or coupled to the first driving power supply VDD via the pixel driving circuit 144. A second electrode (for example, a cathode electrode) of each of the light emitting elements LD may be electrically connected or coupled to the second driving power supply VSS. Each of the light emitting elements LD may emit light at a luminance corresponding to driving current that is controlled by the pixel driving circuit 144.

Although FIGS. 3A to 3D illustrate that the light emitting elements LD are electrically connected or coupled in parallel to each other in the same direction (for example, a forward direction) between the first and second driving power supplies VDD and VSS, the disclosure is not limited thereto. For example, some or a number of the light emitting elements LD may be electrically connected or coupled to each other in the forward direction between the first and second driving power supplies VDD and VSS, and the other light emitting elements LD may be electrically connected or coupled to each other in the reverse direction.

One of the first and second driving power supplies VDD and VSS may be supplied in the form of an AC voltage. The light emitting elements LD may alternately emit light by the same connection direction groups. As an example, the first sub-pixel SP1 may include only a single light emitting element LD.

The pixel driving circuit 144 may include first and second transistors T1 and T2, and a storage capacitor Cst. The structure of the pixel driving circuit 144 is not limited to that of the embodiment illustrated in FIG. 3A.

A first electrode of the first transistor (T1; switching transistor) may be electrically connected or coupled to a data line Dj, and a second electrode thereof may be electrically connected or coupled to a first node N1. Here, the first electrode and the second electrode of the first transistor T1 may be different electrodes. If the first electrode is a source electrode, the second electrode is a drain electrode. A gate electrode of the first transistor T1 may be electrically connected or coupled to the scan line Si.

When a scan signal having a voltage (for example, a low-level voltage) turning on the first transistor T1 is supplied from the scan line Si, the first transistor T1 may be turned on to electrically connect or couple the data line Dj with the first node N1. Here, a data signal of a corresponding frame is supplied to the data line Dj, whereby the data signal is transmitted to the first node N1. The data signal transmitted to the first node N1 may be charged to the storage capacitor Cst.

A first electrode of the second transistor (T2; driving transistor) may be electrically connected or coupled to the first driving power supply VDD, and a second electrode of the second transistor (T2; driving transistor) may be electrically connected or coupled to the first electrode of each of the light emitting elements LD. A gate electrode of the second transistor T2 may be electrically connected or coupled to the first node N1. As such, the second transistor T2 may control the amount of driving current to be supplied to the light emitting elements LD in response to the voltage of the first node N1.

One or an electrode of the storage capacitor Cst may be electrically connected or coupled to the first driving power supply VDD, and the other or another electrode thereof may be electrically connected or coupled to the first node N1. The storage capacitor Cst is charged with a voltage corresponding to a data signal supplied to the first node N1, and maintains the charged voltage until a data signal of a subsequent frame is supplied.

For the sake of explanation, FIG. 3A illustrates the pixel driving circuit 144 having a relatively simple structure including the first transistor T1 to transmit the data signal to the first sub-pixel SP1, the storage capacitor Cst to store the data signal, and the second transistor T2 to supply driving current corresponding to the data signal to the light emitting elements LD.

However, the disclosure is not limited thereto, and the structure of the pixel driving circuit 144 may be changed in various ways. For example, the pixel driving circuit 144 may further include at least one transistor element such as a transistor element to compensate for the threshold voltage of the second transistor T2, a transistor element to initialize the first node N1, and/or a transistor element to control an emission time of the light emitting elements LD, or other circuit elements such as a boosting capacitor for boosting the voltage of the first node N1.

Furthermore, although FIG. 3A illustrates that the transistors, for example, the first and second transistors T1 and T2, included in the pixel driving circuit 144 are formed of P-type transistors, the type of the transistor is not limited thereto. For example, at least one of the first and second transistors T1 and T2 included in the pixel driving circuit 144 may be an N-type transistor.

Figure 3B:
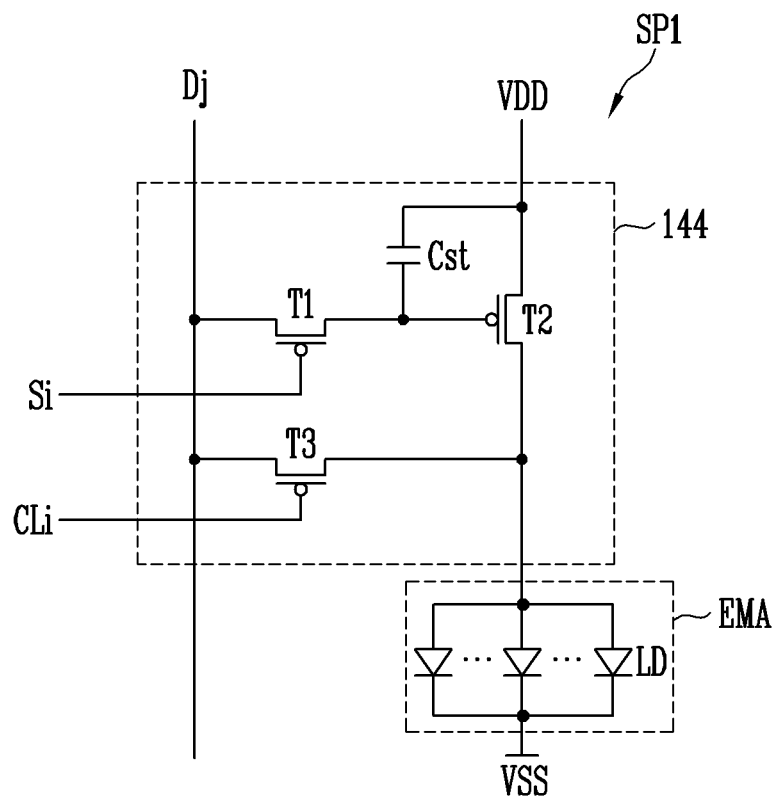

As illustrated in FIG. 3B, the pixel driving circuit 144 may further include a third transistor T3 as well as including the first and second transistors T1 and T2. The third transistor T3 may be electrically connected or coupled between the j-th data line Dj and the anode electrode of each of the light emitting elements LD. The gate electrode of the third transistor T3 may be electrically connected or coupled to the control line CLi so that the third transistor T3 may be turned on when a control signal is supplied to the control line CLi, and be turned off in other cases.

For convenience sake, FIG. 3B illustrates that all of the first to third transistors T1 to T3 are formed of P-type transistors, but the disclosure is not limited thereto. For example, at least one of the first to third transistors T1 to T3 included in the pixel driving circuit 144 may be formed of an N-type transistor, or all of the first to third transistors T1 to T3 may be N-type transistors.

Figure 3C:
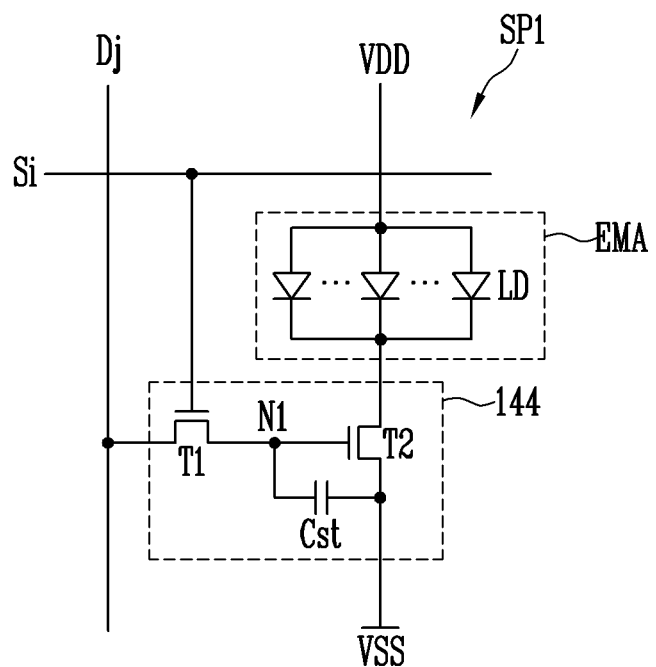

Referring to FIGS. 1, 2, and 3C, the first and second transistors T1 and T2 may be N-type transistors. The structure and operation of the driving circuit 144 illustrated in FIG. 3C, other than a change in connection positions of some or a number of components due to a change in the type of transistor, are similar to those of the pixel driving circuit 144 of FIG. 3A. Therefore, detailed descriptions pertaining to this will be omitted.

Figure 3D:
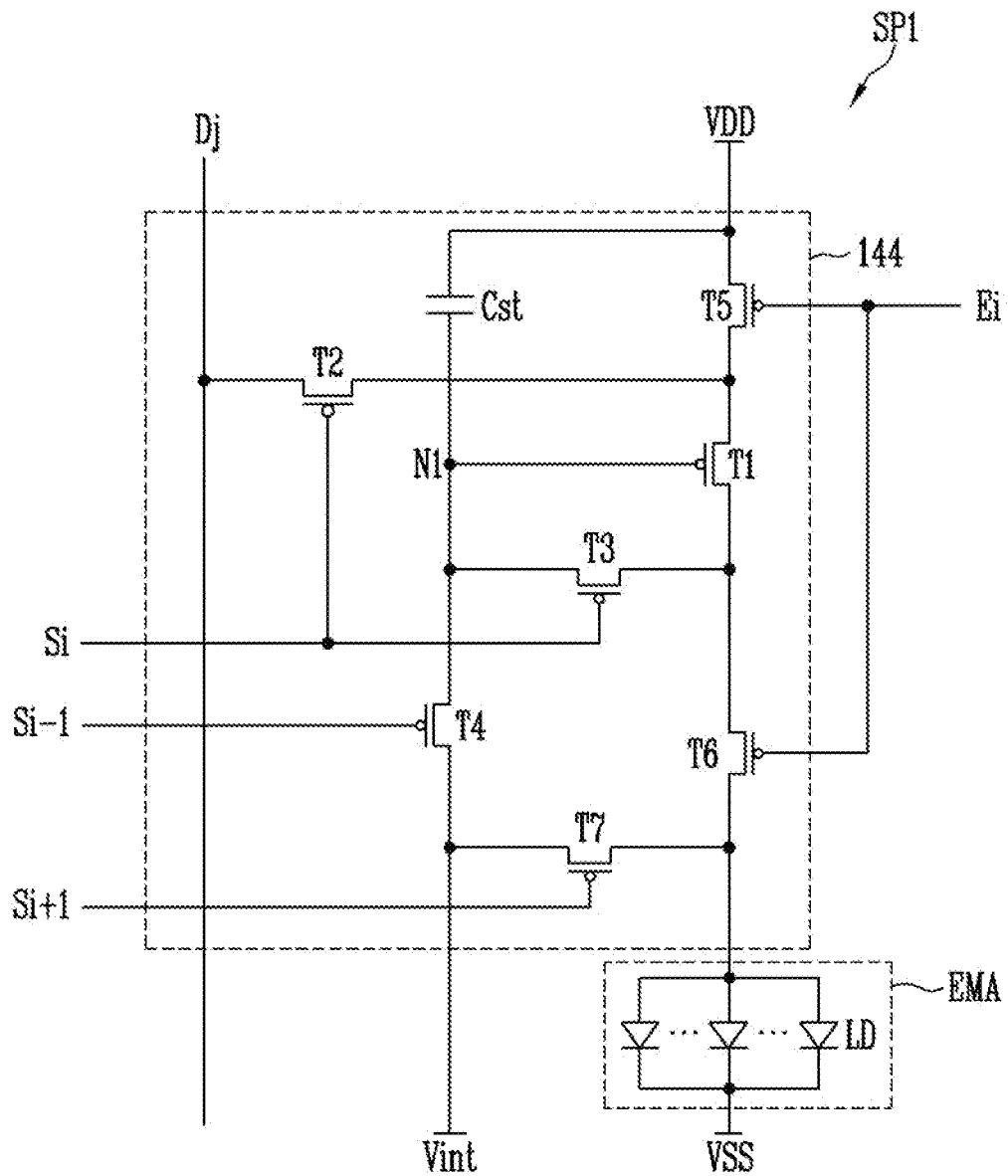

Referring to FIGS. 1, 2, and 3D, the pixel driving circuit 144 may be electrically connected or coupled to the scan line Si and the data line Dj of the first sub-pixel SP1. For example, if the first sub-pixel SP1 is disposed on an i-th row and a j-th column of the display area DA, the pixel driving circuit 144 of the first sub-pixel SP1 may be electrically connected or coupled to an i-th scan line Si and a j-th data line Dj of the display area DA.

Furthermore, the pixel driving circuit 144 may also be electrically connected or coupled to at least one other scan line. For example, the first sub-pixel SP1 disposed on the i-th row of the display area DA may be further electrically connected or coupled to an i−1-th scan line Si−1 and/or an i+1-th scan line Si+1.

The pixel driving circuit 144 may be electrically connected or coupled not only to the first and second driving power supplies VDD and VSS but also to a third power supply. For example, the pixel driving circuit 144 may also be electrically connected or coupled to an initialization power supply Vint.

The pixel driving circuit 144 may include first to seventh transistors T1 to T7, and a storage capacitor Cst.

A first electrode of the first transistor (T1; driving transistor), for example, a source electrode, may be electrically connected or coupled to the first driving power supply VDD via the fifth transistor T5, and a second electrode thereof, for example, a drain electrode, may be electrically connected or coupled to one ends of light emitting elements LD via the sixth transistor T6. A gate electrode of the first transistor T1 may be electrically connected or coupled to a first node N1. The first transistor T1 may control driving current flowing between the first driving power supply VDD and the second driving power supply VSS via the light emitting elements LD in response to the voltage of the first node N1.

The second transistor (T2; switching transistor) may be electrically connected or coupled between the j-th data line Dj electrically connected or coupled to the first sub-pixel SP1 and the source electrode of the first transistor T1. A gate electrode of the second transistor T2 may be electrically connected or coupled to the i-th scan line Si electrically connected or coupled to the first sub-pixel SP1. When a scan signal having a gate-on voltage (for example, a low-level voltage) is supplied from the i-th scan line Si, the second transistor T2 may be turned on to electrically connect or couple the j-th data line Dj to the source electrode of the first transistor T1. Hence, if the second transistor T2 is turned on, a data signal supplied from the j-th data line Dj may be transmitted to the first transistor T1.

The third transistor T3 may be electrically connected or coupled between the drain electrode of the first transistor T1 and the first node N1. A gate electrode of the third transistor T3 may be electrically connected or coupled to the i-th scan line Si. When a scan signal having a gate-on voltage is supplied from the scan line Si, the third transistor T3 may be turned on to electrically connect or couple the drain electrode of the first transistor T1 to the first node N1. Therefore, when the third transistor T3 is turned on, the first transistor T1 may be electrically connected in the form of a diode.

The fourth transistor T4 may be electrically connected or coupled between the first node N1 and the initialization power supply Vint. A gate electrode of the fourth transistor T4 may be electrically connected or coupled to a preceding scan line, for example, an i−1-th scan line Si−1. When a scan signal of a gate-on voltage is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be electrically connected or coupled between the first driving power supply VDD and the first transistor T1. A gate electrode of the fifth transistor T5 may be electrically connected or coupled to a corresponding emission control line, for example, an i-th emission control line Ei. The fifth transistor T5 may be turned off when an emission control signal having a gate-off voltage is supplied to the i-th emission control line Ei, and may be turned on in other cases.

The sixth transistor T6 may be electrically connected or coupled between the first transistor T1 and first ends of the light emitting elements LD. A gate electrode of the sixth transistor T6 may be electrically connected or coupled to the i-th emission control line Ei. The sixth transistor T6 may be turned off when an emission control signal having a gate-off voltage is supplied to the i-th emission control line Ei, and may be turned on in other cases.

The seventh transistor T7 may be electrically connected or coupled between the first ends of the light emitting elements LD and the initialization power supply Vint. A gate electrode of the seventh transistor T7 may be electrically connected or coupled to any one of scan lines of a subsequent stage, for example, to the i+1-th scan line Si+1. When a scan signal of a gate-on voltage is supplied to the i+1-th scan line Si+1, the seventh transistor T7 may be turned on so that the voltage of the initialization power supply Vint may be supplied to the first ends of the light emitting elements LD.

The storage capacitor Cst may be electrically connected or coupled between the first driving power supply VDD and the first node N1. The storage capacitor Cst may store a voltage corresponding both to the data signal applied to the first node N1 during each frame period and to the threshold voltage of the first transistor T1.

For convenience sake, FIG. 3D illustrates that all of the first to seventh transistors T1 to T7 are formed of P-type transistors, but the disclosure is not limited thereto. For example, at least one of the first to seventh transistors T1 to T7 included in the pixel driving circuit 144 may be formed of an N-type transistor, or all of the first to seventh transistors T1 to T7 may be N-type transistors.

Hereinafter, the pixel of the display device of FIG. 2 will be described in detail with reference to the accompanying drawings.

Figure 4A:
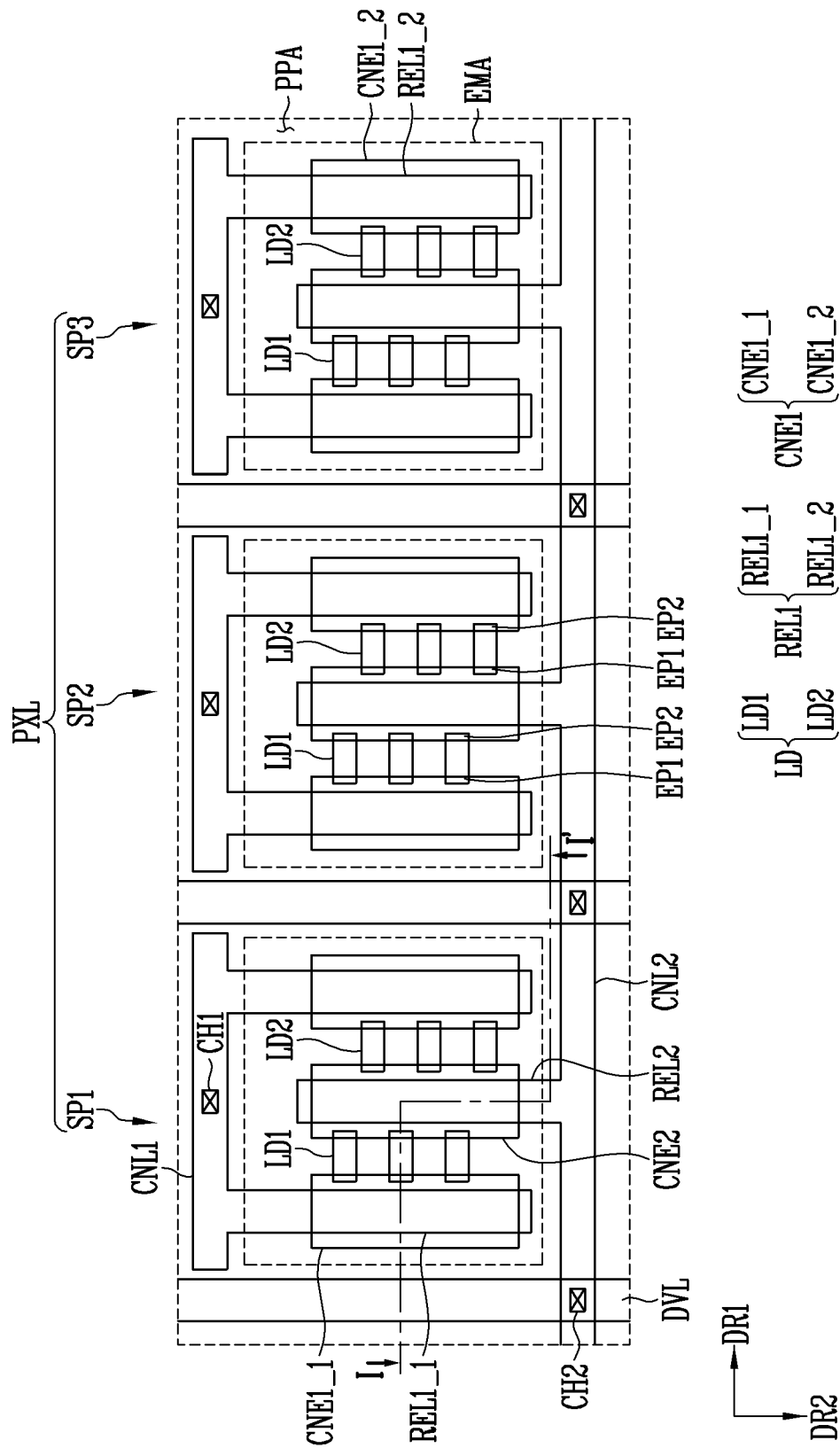
FIG. 4A is a plan view schematically illustrating first to third sub-pixels included in one of the pixels illustrated in FIG. 2.
Figure 4B:
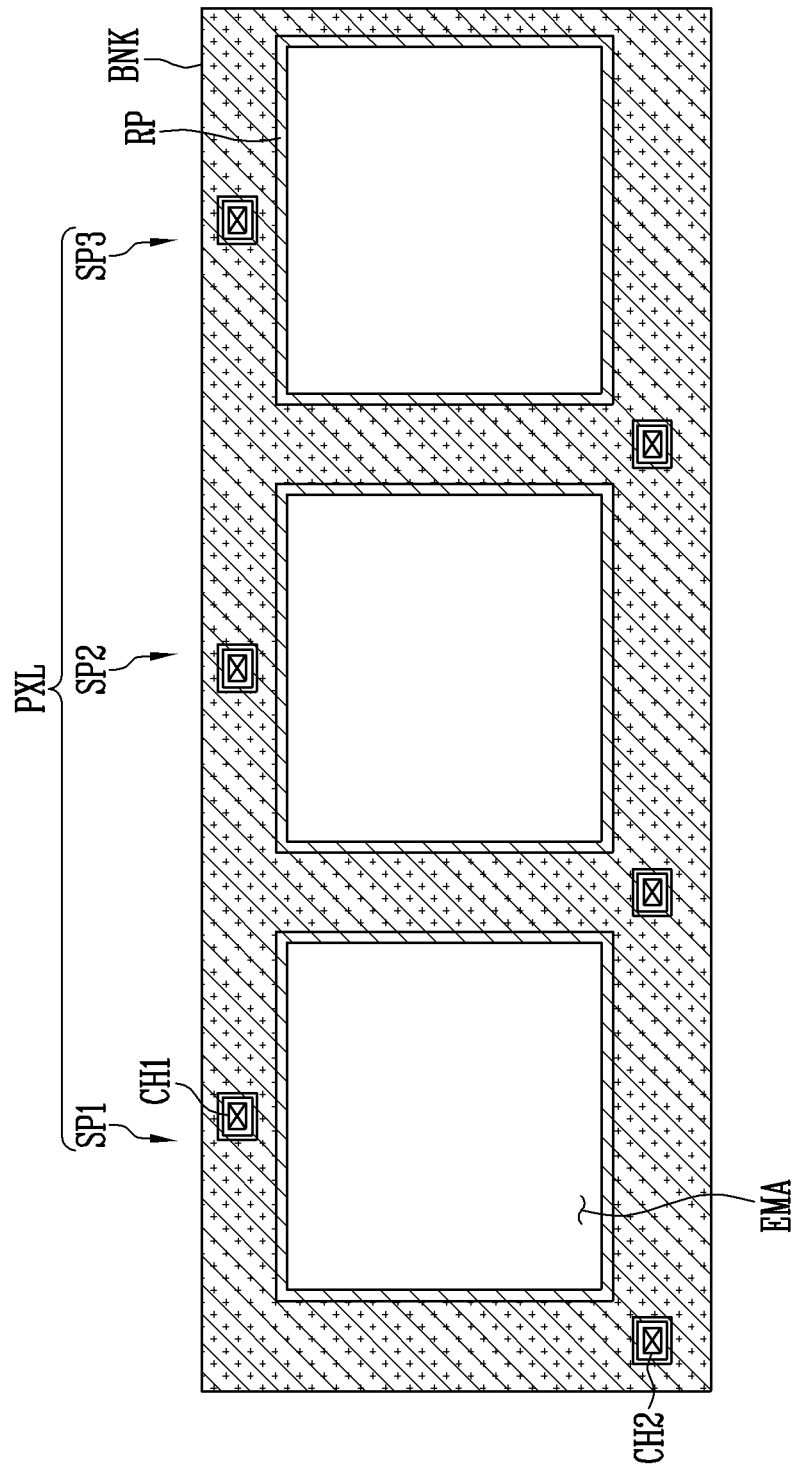
FIG. 4B is a diagram illustrating a bank and a reflective pattern of FIG. 4A.
Figure 5:
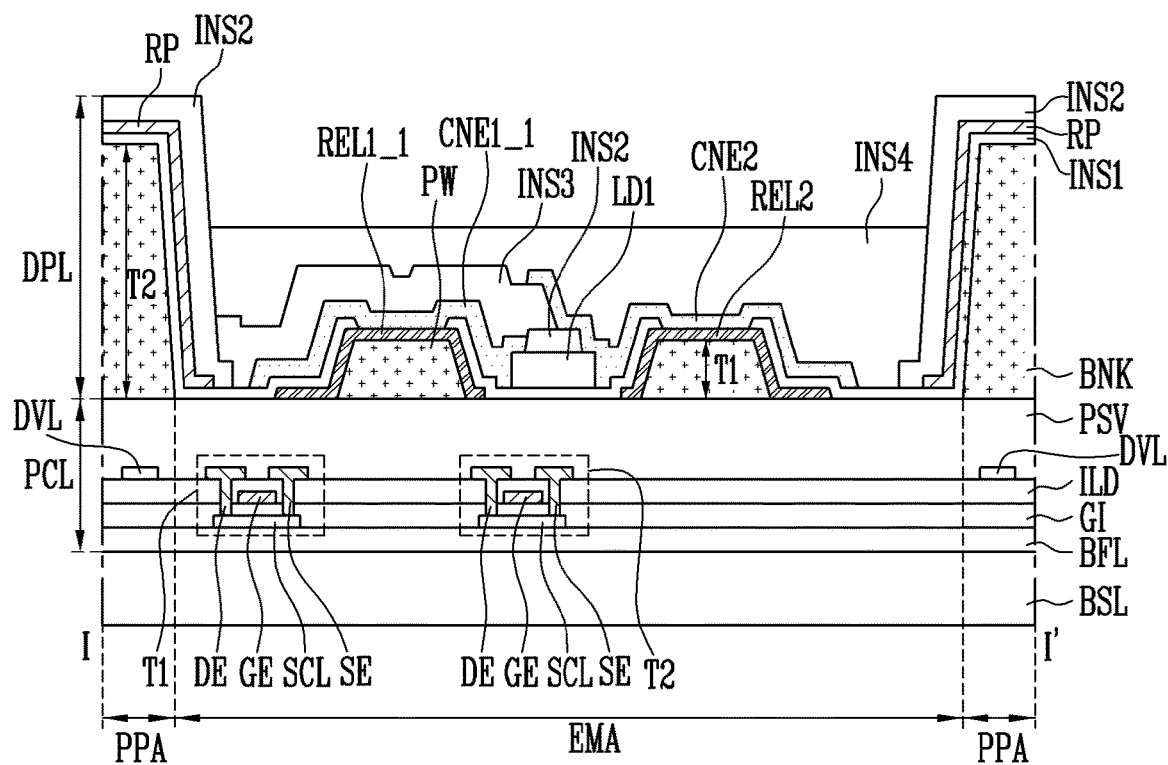
FIG. 5 is a sectional view taken along line I-I' of FIG. 4A.

FIG. 4A is a plan view schematically illustrating first to third sub-pixels included in one of the pixels illustrated in FIG. 2. FIG. 4B is a diagram illustrating a bank and a reflective pattern of FIG. 4A. FIG. 5 is a sectional view taken along line I-I' of FIG. 4A.

Although, for the sake of explanation, FIG. 4A illustrates that a plurality of light emitting elements LD provided or disposed in each sub-pixel are horizontally aligned, the arrangement of the light emitting elements LD is not limited thereto. For example, at least some or a number of the light emitting elements LD may be aligned in a direction intersecting with the horizontal direction. Furthermore, for the sake of explanation, illustration of transistors electrically connected or coupled to the light emitting elements LD, and signal lines electrically connected or coupled to the transistors has been omitted in FIG. 4A. Moreover, although FIGS. 4A and 5 illustrate a simplified structure of the one pixel PXL, for example, showing that each electrode has only a single electrode layer, the disclosure is not limited thereto.

Referring to FIGS. 1 to 5, the display device in accordance with an embodiment may include a base layer BSL on which a plurality of pixels PXL may be provided or disposed.

Each of the pixels PXL may include a first sub-pixel SP1, a second sub-pixel SP2, and a third sub-pixel SP3 provided or disposed on the base layer BSL. In an embodiment, the first sub-pixel SP1 may be a red sub-pixel to emit red light, the second sub-pixel SP2 may be a green sub-pixel to emit green light, and the third sub-pixel SP3 may be a blue sub-pixel to emit blue light.

Each of the first to third sub-pixels SP1 to SP3 may include an emission area EMA to emit light, and a non-emission area PPA disposed around a perimeter of the emission area EMA.

Each of the first to third sub-pixels SP1 to SP3 may include a base layer BSL, a pixel circuit layer PCL, and a display element layer DPL.

The pixel circuit layer PCL may include a buffer layer BFL disposed on the base layer BSL, first and second transistors T1 and T2 disposed on the buffer layer BFL, and a driving voltage line DVL. Furthermore, the pixel circuit layer PCL of each of the first to third sub-pixels SP1 to SP3 may further include a passivation layer PSV disposed on the first and second transistors T1 and T2 and the driving voltage line DVL.

The base layer BSL may be a rigid or flexible substrate, and the material or properties thereof are not particularly limited. For example, the base layer BSL may be a rigid substrate made of glass or reinforced glass, or a flexible substrate formed of a thin film made of plastic or metal. The base layer BSL may be a transparent substrate, but the disclosure is not limited thereto, and the base layer BSL may be a translucent substrate, an opaque substrate, or a reflective substrate. Furthermore, although in the drawings there is illustrated the case where the base layer BSL has a single-layer structure, the base layer BSL may have a multilayer structure.

The buffer layer BFL may prevent impurities from being diffused into the first and second transistors T1 and T2. The buffer layer BFL may be omitted depending on the material of the substrate SUB or processing conditions.

The first transistor T1 may be electrically connected or coupled with some or a number of the light emitting elements LD provided or disposed on the display element layer DPL of the corresponding sub-pixel. The first transistor T1 may be a driving transistor to drive the light emitting elements LD. The second transistor T2 may be a switching transistor to switch the first transistor T1.

Each of the first and second transistors T1 and T2 may include a semiconductor layer SCL, a gate electrode GE, a source electrode SE, and a drain electrode DE.

The semiconductor layer SCL may be disposed on the buffer layer BFL. The semiconductor layer SCL may include a source area contacting the source electrode SE, and a drain area contacting the drain electrode DE. An area between the source area and the drain area may be a channel area.

The semiconductor layer SCL may be a semiconductor pattern formed of polysilicon, amorphous silicon, an oxide semiconductor, or the like within the spirit and the scope of the disclosure. The channel area may be an intrinsic semiconductor, which may be an undoped semiconductor pattern. Each of the source area and the drain area may be a semiconductor pattern doped with an impurity.

The gate electrode GE may be provided or disposed on the semiconductor layer SCL with the gate insulating layer GI interposed therebetween. The source electrode SE and the drain electrode DE may respectively contact the source area and the drain area of the semiconductor layer SCL through corresponding contact holes passing through an interlayer insulating layer ILD and the gate insulating layer GI.

In the drawings, although the first and second transistors T1 and T2 are Low Temperature Polycrystalline Silicon (LTPS) thin-film transistors, the first and second transistors T1 and T2 are not limited thereto.

Furthermore, although in the drawings the driving voltage line DVL is illustrated as being disposed on the interlayer insulating layer ILD, the location of the driving voltage line DVL is not limited thereto. For example, the driving voltage line DVL may be disposed on any one insulating layer or layers included in the pixel circuit layer PCL. The second driving power supply (refer to VSS of FIG. 3A) may be applied to the driving voltage line DVL.

The passivation layer PSV may include a first contact hole CH1 which exposes a portion of the drain electrode DE of the first transistor T1, and a second contact hole CH2 which exposes a portion of the driving voltage line DVL.

The display element layer DPL may be disposed on the pixel circuit layer PCL. The display element layer DPL may include a partition wall PW, a bank BNK, a reflective pattern RP, first and second electrodes REL1 and REL2, first and second connection lines CNL1 and CNL2, a plurality of light emitting elements LD, first and second contact electrodes CNE1 and CNE2, or the like within the spirit and the scope of the disclosure.

The partition wall PW may be disposed in the first to third sub-pixels SP1 to SP3. In detail, the partition wall PW may be provided or disposed on the passivation layer PSV in the emission area EMA of each of the first to third sub-pixels SP1 to SP3. At least two partition walls PW may be disposed in each sub-pixel. The partition walls disposed adjacent to each other are spaced apart from each other by a predetermined distance. In the drawings, three partition walls PW are disposed in each sub-pixel at positions spaced apart from each other by a predetermined distance, but the disclosure is not limited thereto.

The adjacent partition walls PW may be disposed on the passivation layer PSV and spaced apart from each other by a length L of one light emitting element LD or more. The light emitting elements LD may be disposed between the adjacent partition walls PW in the emission area EMA. In the perimeter of the emission area EMA, the partition walls PW are disposed between the light emitting element LD and the bank BNK.

The partition wall PW may include a substantially curved surface having a cross-sectional shape such as substantially a semicircle, or substantially a semi-ellipse which may be reduced in width upward from one or a surface of the passivation layer PSV. In the drawings, the partition wall PW is illustrated as having a substantially trapezoidal cross-section. In a sectional view, the shape of each of the partition wall PW is not limited to the foregoing examples, and may be changed in various ways within a range in which the efficiency of light emitted from each of the light emitting elements LD can be enhanced. The two adjacent partition walls PW may be disposed on the same layer on the passivation layer PSV and have the same height.

The bank BNK may be further disposed on the passivation layer PSV. The bank BNK may be disposed between the adjacent sub-pixels SP1 to SP3, separate the adjacent sub-pixels SP1 to SP3 from each other, and prevent light emitted from the sub-pixels SP1 to SP3 from traveling toward the adjacent sub-pixels SP1 to SP3. The bank BNK may have a thickness T2 greater than a thickness T1 of the partition wall PW.

Furthermore, the bank BNK may define or form the emission area EMA of each of the sub-pixels SP1 to SP3. Although an area in which the bank BNK is disposed corresponds to the non-emission area PPA of each of the sub-pixels SP1 to SP3, light emitted from the light emitting element LD may be reflected by the reflective pattern RP disposed on the bank BNK and travel upward. Therefore, although the bank BNK is disposed in the non-emission area PPA, the display device according to the disclosure makes it possible to emit light even in the area in which the bank BNK is disposed.

The partition wall PW and the bank BNK may be formed of the same material or similar material and may be disposed on the same layer. For example, although the partition wall PW and the bank BNK may be formed of an organic insulating material including organic material, but the disclosure is not limited thereto.

The bank BNK may be formed of a material different from that of the partition wall PW. For example, the bank BNK may include Cr, a double layer including Cr or CrOx, resin including carbon pigment, black dye, graphite, or the like within the spirit and the scope of the disclosure. In the case where the bank BNK is formed of resin including carbon pigment, the carbon pigment may be carbon black which is black pigment having a light shielding function. The bank BNK may function as a black matrix preventing color mixture from being caused between the sub-pixels SP1, SP2, and SP3.

The bank BNK may include a substantially curved surface having a cross-sectional shape such as substantially a semicircle, or a semi-ellipse which may be reduced in width upward from one or a surface of the passivation layer PSV. In the drawings, the bank BNK is illustrated as having a substantially trapezoidal cross-section. However, in a sectional view, the shape of the bank BNK is not limited to the foregoing embodiments, and may be changed in various ways within a range preventing light interference between the adjacent sub-pixels SP1 to SP3.

The first connection line CNL1 may be electrically connected or coupled with the pixel circuit layer PCL through the first contact hole CH1 formed in the passivation layer PSV. In detail, the first connection line CNL1 may be electrically connected with a portion of the drain electrode DE of the first transistor T1 of the pixel circuit layer PCL. Although FIG. 4A illustrates that the first contact hole CH1 is formed in the non-emission area PPA, the first contact hole CH1 may be formed in the emission area EMA.

The first connection line CNL1 may extend from each of the first to third sub-pixels SP1 to SP3 in the first direction DR1. The first connection line CNL1 may be provided or disposed in only one corresponding sub-pixel so as to independently drive each of the first to third sub-pixels SP1 to SP3.

The second connection line CNL2 may also be electrically connected or coupled with the pixel circuit layer PCL through the second contact hole CH2 formed in the passivation layer PSV. In detail, the second connection line CNL2 may be electrically connected with a portion of the driving voltage line DVL of the pixel circuit layer PCL.

The second connection line CNL2 may extend in a direction parallel to a direction in which the first connection line CNL1 extends. The second connection line CNL2 may be provided or disposed in common to the first to third sub-pixels SP1 to SP3. Therefore, the first to third sub-pixels SP1 to SP3 may be electrically connected or coupled in common to the second connection line CNL2.

Each of the first and second electrodes REL1 and REL2 may be provided or disposed on the emission area EMA of each of the first to third sub-pixels SP1 to SP3 and extend in the second direction DR2 intersecting with the first direction DR1. The first and second electrodes REL1 and REL2 may be provided or disposed on the same plane and spaced apart from each other by a predetermined distance.

The first electrode REL1 may be electrically connected or coupled to the first connection line CNL1. For example, the first electrode REL1 may be integrally coupled with the first connection line CNL1 or integral with each other. In the drawings, there is illustrated the case where the first electrode REL1 may include a 1-1-th electrode REL1_1 and a 1-2-th electrode REL1_2 which diverge in the second direction DR2 from the first connection line CNL1 extending in the first direction DR1. The 1-1-th electrode REL1_1, the 1-2-th electrode REL1_2, and the first connection line CNL1 may be integral with each other and electrically and/or physically connected or coupled to each other.

Where the first electrode REL1 and the first connection line CNL1 are formed and/or provided integrally with each other, the first connection line CNL1 may be regarded as one or an area of the first electrode REL1 However, the disclosure is not limited thereto. For example, in an embodiment, the first electrode REL1 and the first connection line CNL1 may be individually formed and electrically connected or coupled to each other through a contact hole, via hole, or the like, which is not illustrated.

The second electrode REL2 may be electrically connected or coupled to the second connection line CNL2. For example, the second electrode REL2 may be integrally coupled with the second connection line CNL2. In the drawings, there is illustrated a structure in which the second connection line CNL2 extends in the first direction DR1, and the second electrode REL2 diverges from the second connection line CNL2 in the second direction DR2.

Where the second electrode REL2 and the second connection line CNL2 are formed and/or provided integrally with each other, the second connection line CNL2 may be regarded as one or an area of the second electrode REL2. However, the disclosure is not limited thereto. For example, in an embodiment, the second electrode REL2 and the second connection line CNL2 may be individually formed and electrically connected or coupled to each other through a contact hole, via hole, or the like, which is not illustrated.

Each of the first and second electrodes REL1 and REL2 may function as an alignment electrode for aligning the light emitting elements LD in the emission area EMA of each of the first to third sub-pixels SP1 to SP3.

In detail, before the light emitting elements LD are aligned in the emission area EMA of each of the first to third sub-pixels SP1 to SP3, a first alignment voltage may be applied to the first electrode REL1 through the first connection line CNL1, and a second alignment voltage may be applied to the second electrode REL2 through the second connection line CNL2. The first alignment voltage and the second alignment voltage may have different voltage levels. As predetermined alignment voltages having different voltage levels are respectively applied to the first electrode REL1 and the second electrode REL2, an electric field may be formed between the first electrode REL1 and the second electrode REL2. Hence, the light emitting elements LD may be aligned between the first electrode REL1 and the second electrode REL2.

In a plan view, the second electrode REL2 may be provided or disposed between the 1-1-th electrode REL1_1 and the 1-2-th electrode REL1_2 and spaced apart from each of the 1-1-th and 1-2-th electrodes REL1_1 and REL1_2 by a predetermined distance.

After the light emitting elements LD are aligned in the emission area EMA of each of the first to third sub-pixels SP1 to SP3, each of the first and second electrodes REL1 and REL2 may function as a driving electrode for driving the light emitting elements LD.

The first and second electrodes REL1 and REL2 each may have a shape substantially corresponding to that of the partition wall PW, and thus may be made of material having a predetermined reflectivity to allow light emitted from the opposite ends EP1 and EP2 of each of the light emitting elements LD to travel in a direction (for example, in a frontal direction) in which an image of the display device is displayed. The first and second electrodes REL1 and REL2 may function as reflectors for enhancing the efficiency of light emitted from the light emitting elements LD.

In detail, the first and second electrodes REL1 and REL2, and the first and second connection lines CNL1 and CNL2 may be formed of a conductive material having a predetermined reflectivity. Metal, for example, Ag, Mg, Al, Pt, Pd, Au, Ni, Nd, Ir, Cr, T1, and an alloy thereof may be used as the conductive material. However, the materials of the first and second electrodes REL1 and REL2, and the first and second connection lines CNL1 and CNL2 are not limited to the foregoing materials.

Although in the drawings each of the first and second electrodes REL1 and REL2 and the first and second connection lines CNL1 and CNL2 has a single layer structure, it may have a multilayer structure formed by stacking two or more materials among metals, alloys, conductive oxides, and conductive polymers.

Any one of the first and second electrodes REL1 and REL2 may be an anode electrode, and the other may be a cathode electrode. In an embodiment, the first electrode REL1 may be an anode electrode, and the second electrode REL2 may be a cathode electrode.

Each of the light emitting elements LD may be formed of a light emitting element made of material having an inorganic crystal structure and has a subminiature size, for example, corresponding to the nanoscale or the microscale.

Although at least two or tens of light emitting elements LD are provided or disposed in the emission area EMA of each of the first to third sub-pixels SP1 to SP3, the disclosure is not limited thereto. In an embodiment, the number of light emitting elements LD provided or disposed in each sub-pixel may be changed in various ways.

Each of the light emitting elements LD may include a stacked emission pattern formed by successively stacking a first conductive semiconductor layer 11, an active layer 12, and a second conductive semiconductor layer 13 in the longitudinal direction (L) of each light emitting element LD. Furthermore, each of the light emitting elements LD may further include an insulating film 14 which encloses an outer circumferential surface of the stacked emission pattern. In an embodiment, each of the light emitting elements LD may have a substantially cylindrical shape. Each light emitting element LD may have a first end EP1 corresponding to any one of a lower portion of the cylinder and an upper portion of the cylinder, and a second end EP2 corresponding to the other of the lower portion of the cylinder and the upper portion of the cylinder. Any one of the first conductive semiconductor layer 11 and the second conductive semiconductor layer 13 may be disposed on the first end EP1 of each light emitting element LD, and the other of the first conductive semiconductor layer 11 and the second conductive semiconductor layer 13 may be disposed on the second end EP2 thereof.

In an embodiment, the light emitting elements LD may be divided into a plurality of first light emitting elements LD1 aligned between the 1-1-th electrode REL1_1 and the second electrode REL2, and a plurality of second light emitting elements LD2 aligned between the second electrode REL2 and the 1-2-th electrode REL1_2. A second insulating layer INS2 for covering or overlapping a portion of an upper surface of each of the light emitting elements LD may be provided or disposed on the light emitting elements LD. A first insulating layer INS1 may be provided or disposed between each of the light emitting elements LD and the passivation layer PSV.

The first insulating layer INS1 may be disposed into a space between the passivation layer PSV and each of the light emitting elements LD to stably support the light emitting elements LD and prevent the light emitting elements LD from being removed from the passivation layer PSV. The first insulating layer INS1 may be formed of an inorganic insulating layer including an inorganic material, or an organic insulating layer including an organic material. Although in an embodiment the first insulating layer INS1 may be formed of an inorganic insulating layer having an advantage in protecting the light emitting elements LD from the pixel circuit layer PCL, the disclosure is not limited thereto. In an embodiment, the first insulating layer INS1 may be formed of an organic insulating layer that has an advantage in planarization of support surfaces of the light emitting elements LD.

For example, the first insulating layer INS1 may extend to the non-emission area PPA of the sub-pixels SP1, SP2, and SP3 to cover or overlap even a portion of the bank BNK. Although in the drawings the first insulating layer INS1 completely covers or overlaps a side surface and an upper surface of the bank BNK, the first insulating layer INS1 may be disposed to cover or overlap only a portion of the bank BNK.

The reflective pattern RP may be disposed on the bank BNK. The reflective pattern RP may be provided to reflect, upward, light traveling toward sides of each of the sub-pixels SP1, SP2, and SP3.

The light emitting element LD may emit light in the form of Lambertian. In detail, the light emitting elements LD are distributed to have a substantially spherical shape. Thus, in the emission area EMA of each sub-pixel SP1, SP2, SP3, a perimeter of the emission area EMA adjacent to the non-emission area PPA may be less in the amount of light emitted from the light emitting elements LD than a central portion of the emission area EMA.

In an embodiment, the reflective pattern RP disposed on the bank BNK may reflect, in a direction in which an image is displayed, light traveling toward the perimeters of the sub-pixels SP1, SP2, and SP3, in other words, light traveling toward the non-emission area PPA, among light emitted from the sub-pixels SP1, SP2, and SP3. For example, the reflective pattern RP may be formed along the shape of the bank BNK. Therefore, as shown in the drawings, in a case that the bank BNK has a substantially trapezoidal cross-section, light reflected by the reflective pattern RP may efficiently travel in the direction in which an image is displayed.

The reflective pattern RP may include a conductive material having a predetermined reflectivity. Metal, for example, Ag, Mg, Al, Pt, Pd, Au, Ni, Nd, Ir, Cr, T1, and an alloy thereof may be used as the conductive material.

The reflective pattern RP may be formed not only on the side surface of the bank BNK but also on the upper surface of the bank BNK. For example, the reflective pattern RP may be formed to completely cover or overlap the upper surface and the side surface of the bank BNK.

The second insulating layer INS2 may be disposed on the light emitting elements LD. The second insulating layer INS2 may be an organic insulating layer including an organic material. In an embodiment, the second insulating layer INS2 may be provided or disposed on a portion of the upper surface of each of the light emitting elements LD such that the opposite ends EP1 and EP2 of each of the light emitting elements LD may be exposed to the outside. Furthermore, the second insulating layer INS2 may also be disposed on the reflective pattern RP so that the reflective pattern RP can be prevented from being electrically connected with the first or second contact electrodes CNE1 or CNE2.

The first contact electrode CNE1 may be disposed on the first insulating layer INS1 and thus be electrically connected or coupled with the first electrode REL1 that may be exposed by removing a portion of the first insulating layer INS1. The first contact electrode CNE1 may electrically and/or physically reliably couple the first electrode REL1 with one of the opposite ends EP1 and EP2 of the light emitting element LD. The first contact electrode CNE1 may be formed of transparent conductive material to allow light emitted from each of the light emitting elements LD and reflected by the first electrode REL1 in the frontal direction of the display device to travel in the frontal direction without loss.

Here, the first contact electrode CNE1 may include a 1-1-th contact electrode CNE1_1 provided or disposed on the 1-1-th electrode REL1_1, and a 1-2-th contact electrode CNE1_2 provided or disposed on the 1-2-th electrode REL1_2.

A third insulating layer INS3 for covering or overlapping the first contact electrode CNE1 may be provided or disposed on the first contact electrode CNE1. The third insulating layer INS3 may prevent the first contact electrode CNE1 from being exposed to the outside, thus preventing the first contact electrode CNE1 from being corroded.

The third insulating layer INS3 may be formed of an inorganic insulating layer including an inorganic material, or an organic insulating layer including an organic material. Although the third insulating layer INS3 may have a single layer structure as shown in the drawing, the disclosure is not limited thereto. For example, the third insulating layer INS3 may have a multilayer structure. Where the third insulating layer INS3 has a multilayer structure, the third insulating layer INS3 may have a structure formed by alternately stacking a plurality of inorganic insulating layers and a plurality of organic insulating layers. For example, the third insulating layer INS3 may have a structure formed by sequentially stacking a first inorganic insulating layer, an organic insulating layer, and a second inorganic insulating layer.

The second contact electrode CNE2 may also be electrically connected or coupled with the second electrode REL2 that may be exposed by removing a portion of the first insulating layer INS1. The second contact electrode CNE2 may electrically and/or physically reliably connect or couple the second electrode REL2 with the other or another end of the opposite ends EP1 and EP2 of the light emitting element LD, the other end not being electrically connected with the first electrode REL1 The second contact electrode CNE2 may be formed of transparent conductive material to allow light emitted from each of the light emitting elements LD and reflected by the second electrode REL2 in the frontal direction of the display device to travel in the frontal direction without loss.

As described above, the opposite ends EP1 and EP2 of the light emitting elements LD may be respectively electrically connected or coupled to the first electrode REL1 and the second electrode REL2 through the first and second contact electrodes CNE1 and CNE2 so that predetermined voltages can be respectively applied to the opposite ends EP1 and EP2, and each of the light emitting elements LD can emit light by coupling of electron-hole pairs in the active layer 12 of the light emitting element LD. Here, the active layer 12 may emit light having a wavelength in a range of about 400 nm to about 900 nm. However, the wavelength range of light emitted from the active layer 12 is not limited thereto, and may be changed in various ways.

A fourth insulating layer INS4 for covering or overlapping the second contact electrode CNE2 may be provided or disposed on the second contact electrode CNE2. The fourth insulating layer INS4 may prevent the second contact electrode CNE2 from being exposed to the outside, thus preventing the second contact electrode CNE2 from being corroded. The fourth insulating layer INS4 may be formed of either an inorganic insulating layer or an organic insulating layer. Where the fourth insulating layer INS4 is formed of an organic insulating layer, a step difference caused by the partition wall PW, the first and second electrodes REL1 and REL2, the first and second contact electrodes CNE1 and CNE2, for example, may be mitigated.

As described above, in an embodiment, the reflective pattern RP may be formed or disposed on the bank BNK, so that light that is emitted from each of the sub-pixels SP1, SP2, and SP3 and travels toward the bank BNK may be reflected by the reflective pattern RP in the direction in which an image is displayed. Hence, in the display device in accordance with an embodiment, the light output efficiency of the light emitting elements LD may be enhanced, so that the light efficiency of the display device may be enhanced.

Although in the drawings the bank BNK is illustrated as being disposed on the same layer as that of the partition wall PW, the bank BNK may be disposed on a layer different from that of the partition wall PW. Furthermore, although the reflective pattern RP is illustrated as being disposed on a layer different from that of the first and second electrodes REL1 and REL2, the reflective pattern RP may be disposed on the same layer as that of the first and second electrodes REL1 and REL2.

In other words, the positions at which the bank BNK and the reflective pattern RP are formed may be changed in various ways without being limited. Hereinafter, display devices in accordance with embodiments including the bank BNK and the reflective pattern RP which are formed at various positions will be described with reference to the attached drawings.

Figure 6A:
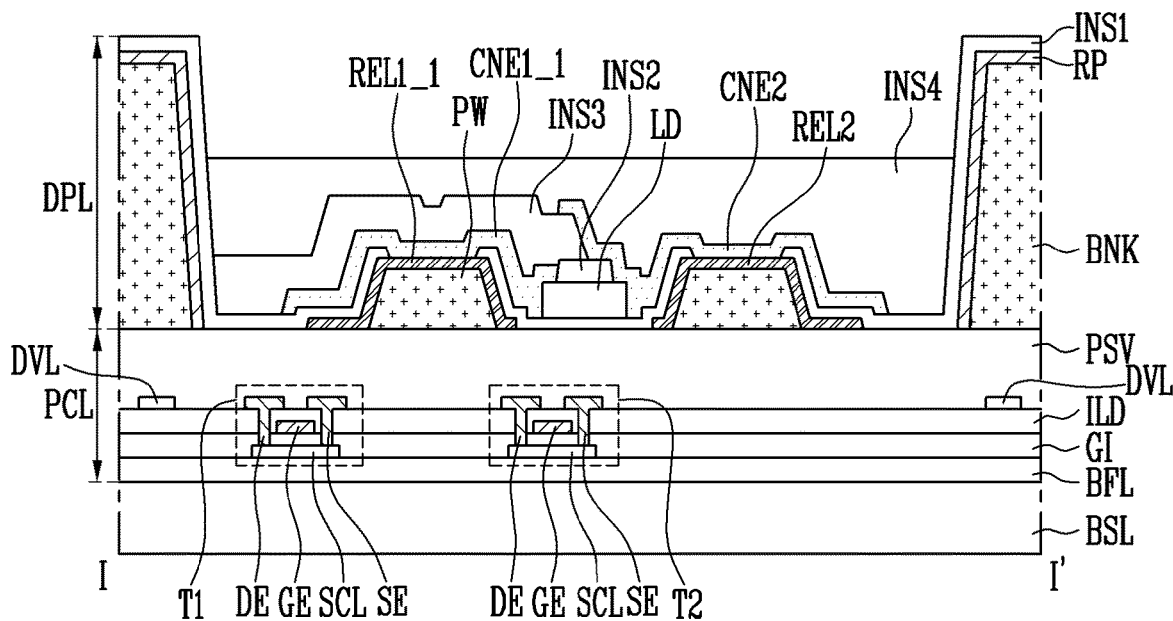
FIGS. 6A to 6C schematically illustrate display devices in accordance with embodiments and are sectional views corresponding to line I-I' of FIG. 4A.
Figure 6B:
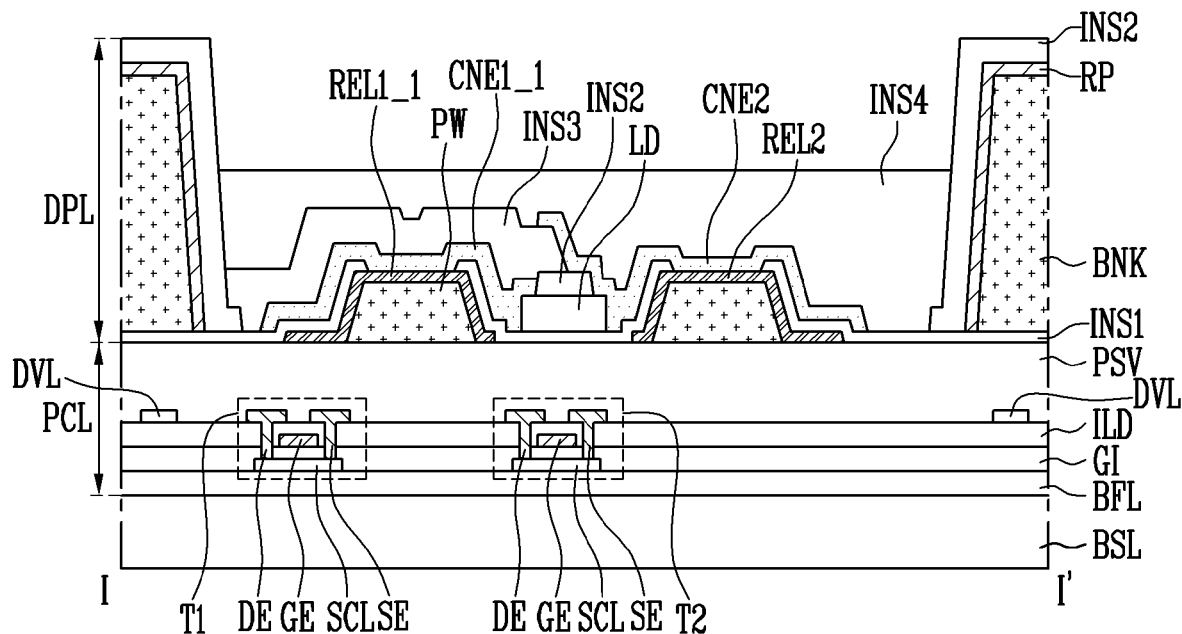
Figure 6C:
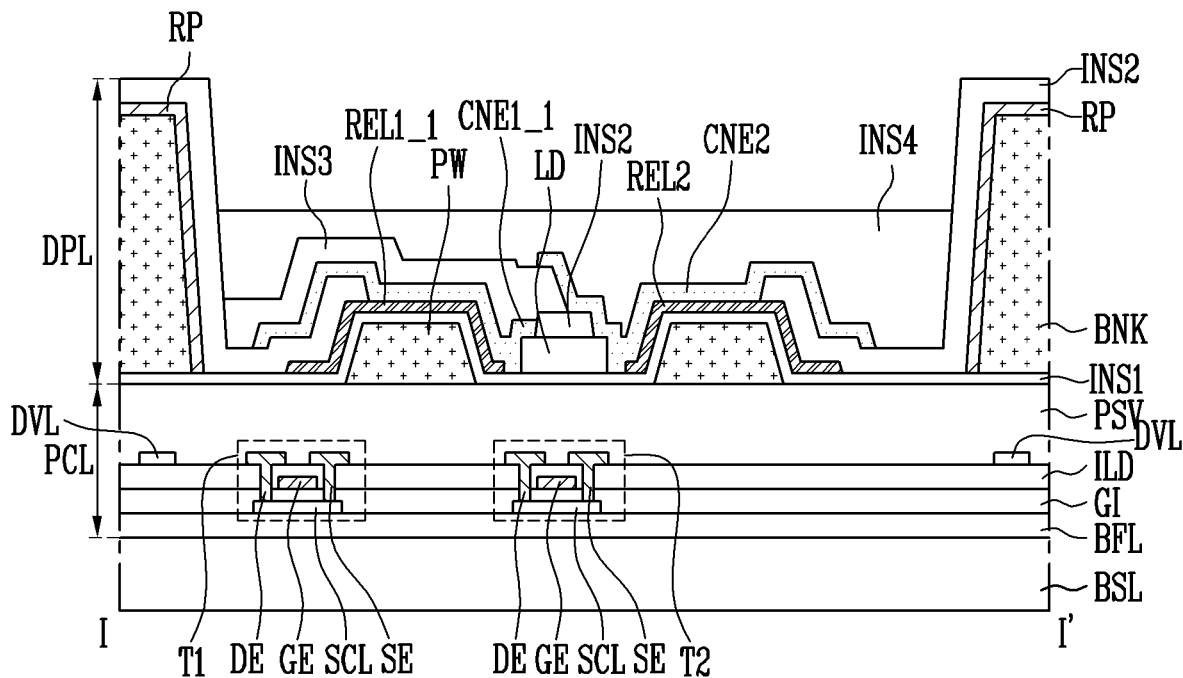

FIGS. 6A to 6C schematically illustrate display devices in accordance with embodiments and are sectional views corresponding to line I-I' of FIG. 4A.

As illustrated in FIG. 6A, the bank BNK and the partition wall PW may be formed on the same layer. The reflective pattern RP and the first and second electrodes REL1 and REL2 may also be disposed on the same layer.

In detail, the bank BNK and the partition wall PW may be formed on the passivation layer PSV of the pixel circuit layer PCL. The bank BNK and the partition wall PW may include the same material or similar material and may be provided or disposed on the same layer. The reflective pattern RP, and the 1-1-th electrode REL1_1 and the second electrode REL2 may be respectively provided or disposed on the bank BNK and the partition wall PW. Here, the reflective pattern RP, the 1-1-th electrode REL1_1, and the second electrode REL2 may also include the same material or similar material and may be provided or disposed on the same layer.

The first insulating layer INS1 may be disposed on the passivation layer PSV to cover or overlap the reflective pattern RP and the 1-1-th electrode REL1_1 and the second electrode REL2. The 1-1-th electrode REL1_1 and the second electrode REL2 may be exposed by removing a portion of the first insulating layer INS1. The exposed 1-1-th electrode REL1_1 and the exposed second electrode REL2 may be electrically connected or coupled to the light emitting element LD through the 1-1-th contact electrode CNE1_1 and the second contact electrode CNE2, respectively.

As illustrated in FIGS. 6B and 6C, the bank BNK and the partition wall PW may be disposed on different layers.

For example, as illustrated in FIG. 6B, the bank BNK and the partition wall PW may be disposed on different layers with the first insulating layer INS1 interposed therebetween. For instance, the partition wall PW may be disposed under or below the first insulating layer INS1, and the bank BNK may be disposed over the first insulating layer INS1. The reflective pattern RP, and the 1-1-th electrode REL1_1 and the second electrode REL2 may also be disposed on different layers with the first insulating layer INS1 interposed therebetween. For example, the 1-1-th electrode REL1_1 and the second electrode REL2 may be disposed under or below the first insulating layer INS1, and the reflective pattern RP may be disposed over the first insulating layer INS1.

As illustrated in FIG. 6C, although the bank BNK and the partition wall PW may be disposed on different layers, all of the reflective pattern RP and the first and second electrodes REL1 and REL2 may be disposed over the first insulating layer INS1. The reflective pattern RP and the first and the second electrodes REL1 and REL2 may include the same material or similar material provided or disposed on the same layer.

As described above, FIGS. 6A to 6C illustrate various embodiments, and the positions at which the bank BNK, the partition wall PW, the 1-1-th electrode REL1_1 and the second electrode REL2, and the reflective pattern RP are formed are not limited to that of the foregoing embodiments.

Hereinafter, a display device including a light conversion pattern layer in accordance with an embodiment will be described.

Figure 7:
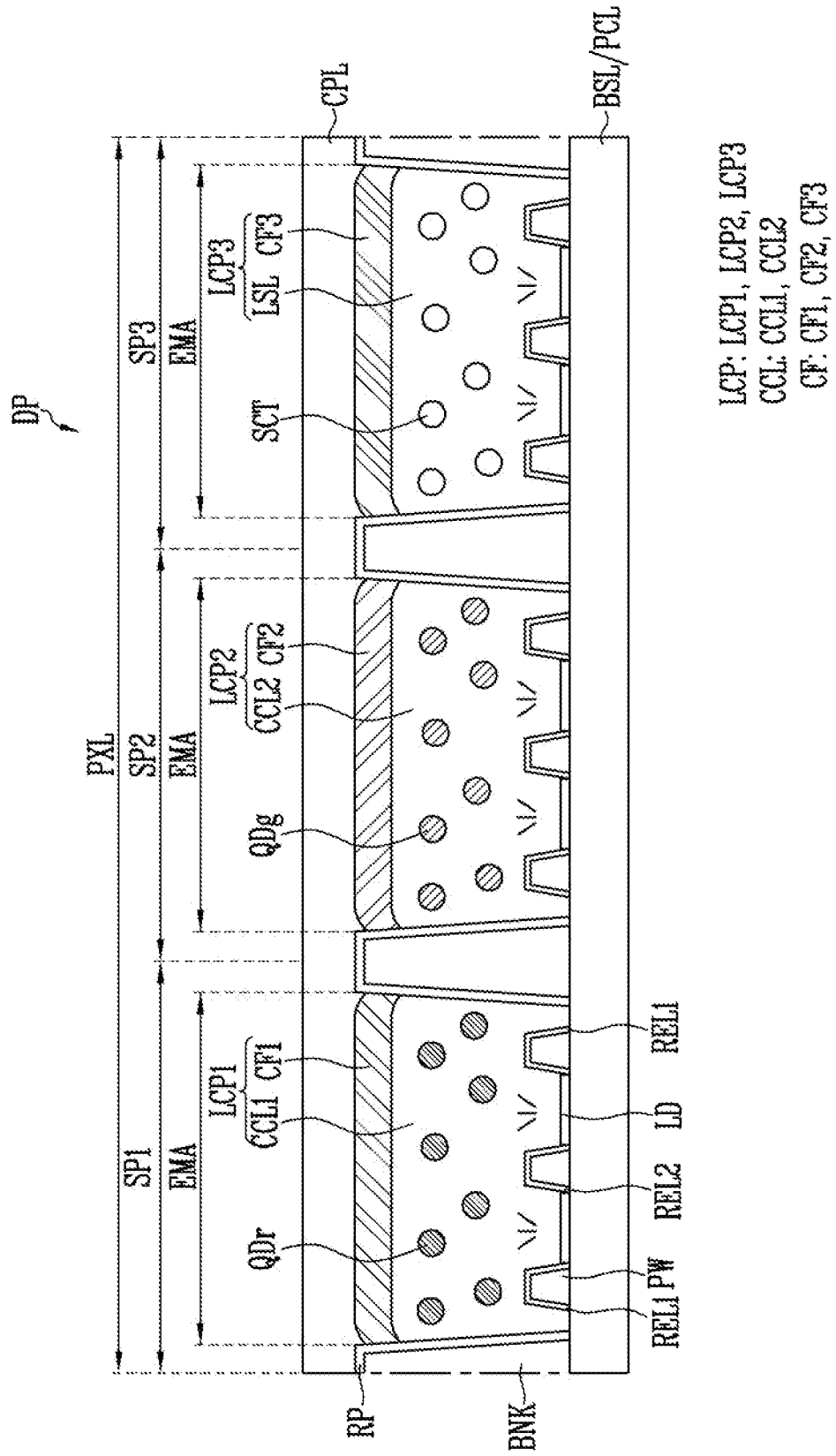
FIG. 7 illustrates a display device in accordance with an embodiment, and is a schematic sectional view illustrating a structure of coupling a light conversion pattern layer to the display device of FIG. 5.

FIG. 7 illustrates a display device in accordance with an embodiment, and is a schematic sectional view illustrating a structure of coupling a light conversion pattern layer to the display device of FIG. 5.

FIG. 7 schematically illustrates a pixel area of one pixel of a plurality of pixels included in the display device, for the convenience of explanation. Furthermore, for the convenience sake, in FIG. 7, structures of some or a number of components similar to those of the display device that are described in detail with reference to FIG. 5 are schematically illustrated, and detailed explanation thereof will be omitted.

Referring to FIGS. 4A, 5, and 7, a display device DP in accordance with an embodiment may include a base layer BSL on which at least one pixel PXL including first, second, and third sub-pixels SP1, SP2, and SP3 is provided or disposed, and a capping layer CPL connected or coupled with the base layer BSL. Each of the sub-pixels SP1, SP2, and SP3 may include a light conversion pattern layer LCP disposed between the base layer BSL and the capping layer CPL.

The capping layer CPL may be disposed to overlap a display area of the base layer BSL and cover or overlap the display element layer DPL, thus preventing oxygen and water from permeating the display element layer DPL. For example, the capping layer CPL may be a rigid substrate made of glass or reinforced glass, or a flexible substrate formed of a thin film made of plastic or metal. Furthermore, the capping layer CPL may be formed of the same material or similar material as that of the base layer BSL, or may be formed of material different from that of the base layer BSL.

The capping layer CPL may be disposed to closely contact the uppermost layer of the display element layer DPL. In the drawing, the capping layer CPL is illustrated as closely contacting the light conversion pattern layer LCP.

The light conversion pattern layer LCP may include a first light conversion pattern layer LCP1 disposed on the first sub-pixel SP1, a second light conversion pattern layer LCP2 disposed on the second sub-pixel SP2, and a third light conversion pattern layer LCP3 disposed on the third sub-pixel SP3. At least some or a number of the first, second, and third light conversion pattern layers LCP1, LCP2, and LCP3 may include a color conversion layer CCL and/or a color filter CF. The color filter CF may include a first color filter CF1, a second color filter CF2, and a third color filter CF3.

In an embodiment, each sub-pixel SP1, SP2, and SP3 may include light emitting elements LD to emit blue light, for example, light ranging from about 430 nm to about 480 nm, the wavelength range of light emitted from the light emitting elements LD is not limited thereto.

For example, the first light conversion pattern layer LCP1 may include a first color conversion layer CCL1 including first color conversion particles corresponding to a first color, and a first color filter CF1 to allow the first color of light to selectively pass therethrough. The second light conversion pattern layer LCP2 may also include a second color conversion layer CCL2 including second color conversion particles corresponding to a second color, and a second color filter CF2 to allow the second color of light to selectively pass therethrough. The third light conversion pattern layer LCP3 may include at least one of a light scattering layer LSL including light scattering particles SCT, and a third color filter CF3 to allow the third color of light to selectively pass therethrough.

In an embodiment, the light emitting elements LD aligned in the emission area EMA of each of the first to third sub-pixels SP1 to SP3 may emit the same color light. A color conversion layer CCL may be disposed over at least some or a number of the first, second, and third sub-pixels SP1, SP2, and SP3. For example, first and second color conversion layers CCL1 and CCL2 may be respectively disposed over the first and second sub-pixels SP1 and SP2. The display device in accordance with an embodiment may display a full-color image.

The first color conversion layer CCL1 may be disposed between the base layer BSL and the capping layer CPL to correspond to the first sub-pixel SP1, and may be formed on or directly formed on the display element layer DPL and disposed into the emission area EMA of the first sub-pixel SP1. In other words, the first color conversion layer CCL1 may be formed on the base layer BSL so that light emitted from the light emitting elements LD may be incident on or directly incident on the first color conversion layer CCL1.

Where the first sub-pixel SP1 is a red sub-pixel, the first color conversion layer CCL1 may include, as the first color conversion particles, red quantum dots QDr which convert blue light emitted from the light emitting elements LD to red light.

The first color filter CF1 may be disposed on the first color conversion layer CCL1, and include color filter material which allows the first color of light converted by the first color conversion layer CCL1 to selectively pass therethrough. For example, the first color filter CF1 may be a red color filter.

The second color conversion layer CCL2 may be disposed between the base layer BSL and the capping layer CPL to correspond to the second sub-pixel SP2, and, be formed on or directly formed on the display element layer DPL and disposed into the emission area EMA of the second sub-pixel SP2. Where the second sub-pixel SP2 is a green sub-pixel, the second color conversion layer CCL2 may include, as the second color conversion particles, green quantum dots QDg which convert blue light emitted from the light emitting elements LD to green light.

The second color filter CF2 may be disposed on the second color conversion layer CCL2, and include color filter material which allows the second color of light converted by the second color conversion layer CCL2 to selectively pass therethrough. For example, the second color filter CF2 may be a green color filter.

The light scattering layer LSL may be disposed between the base layer BSL and the capping layer CPL to correspond to the third sub-pixel SP3, and, be formed on or directly formed on the display element layer DPL and disposed into the emission area EMA of the third sub-pixel SP3. Furthermore, the third color filter CF3 may be further provided or disposed on the light scattering layer LSL.

The third color filter CF3 may include a color filter material which allows a color of light emitted from the light emitting elements LD disposed in the third sub-pixel to selectively pass therethrough. For example, the third color filter CF3 may be a blue color filter.

In the display device having the above-mentioned structure, light emitted from each sub-pixel SP1, SP2, SP3 may pass through the light conversion pattern layer LCP and be emitted to the outside through the capping layer CPL, whereby the display device may form an image. Here, the capping layer CPL may be disposed on or directly disposed on the light conversion pattern layer LCP so that the light conversion pattern layer LCP may be disposed into a space between the bank BNK and the capping layer CPL in each sub-pixel SP1, SP2, SP3. Therefore, the length of a light path along which light emitted from the light emitting elements LD is emitted to the outside through the capping layer CPL may be minimized, so that the light efficiency may be maximized.

Furthermore, in the display device in accordance with the disclosure, the light conversion pattern layer LCP may be disposed, rather than being formed on a separate substrate, in a space defined or formed by the bank BNK by forming the pixel circuit layer PCL, the display element layer DPL, and the light conversion pattern layer LCP on or directly on the base layer BSL. Hence, the process of manufacturing the display device may be simplified.

Where the light conversion pattern layer LCP is formed on a separate substrate, there is the need to perform a process of aligning the base layer BSL with the substrate on which the light conversion pattern layer LCP may be formed. However, in the display device according to the disclosure, the capping layer CPL may be formed on or directly formed on the light conversion pattern layer LCP, so that process risk is reduced.

Hereinafter, a method of manufacturing the display device in accordance with an embodiment will be described in detail with reference to the attached drawings.

FIGS. 8A to 8K are sectional views sequentially illustrating a method of manufacturing the display device of FIG. 5.

Figure 8A:
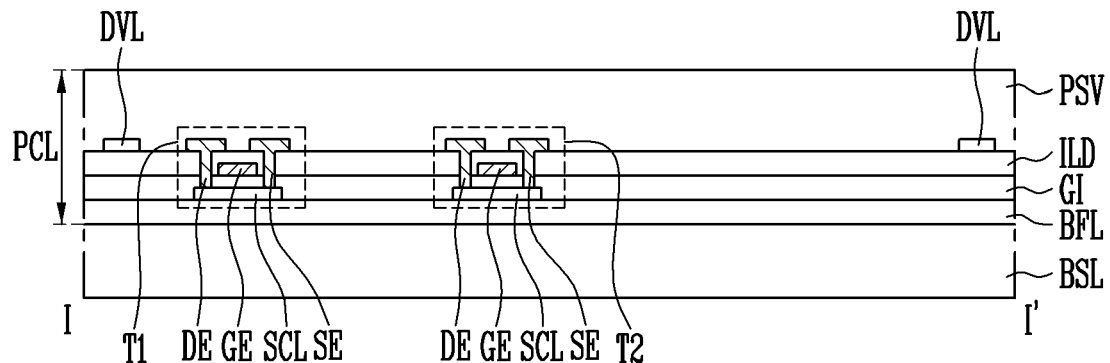
FIGS. 8A to 8K are sectional views sequentially illustrating a method of manufacturing the display device of FIG. 5.

Referring to FIGS. 4A, 5, and 8A, the pixel circuit layer PCL is formed on the base layer BSL of each of the first to third sub-pixels SP1, SP2, and SP3. The pixel circuit layer PCL may include the first and second transistors T1 and T2, the driving voltage line DVL, and the passivation layer PSV.

The first and second contact holes CH1 and CH2 may be formed in the passivation layer PSV. Although not illustrated, the first contact hole CH1 may expose the drain electrode DE of the first transistor T1, and the second contact hole CH2 may expose the driving voltage line DVL.

Here, the first and second contact holes CH1 and CH2 may be formed at any step before the first and second electrodes REL1 and REL2 and the first and second connection lines CNL1 and CNL2 are formed. For example, after the partition wall PW and the bank BNK are formed, the first and second contact holes CH1 and CH2 may be formed.

Figure 8B:
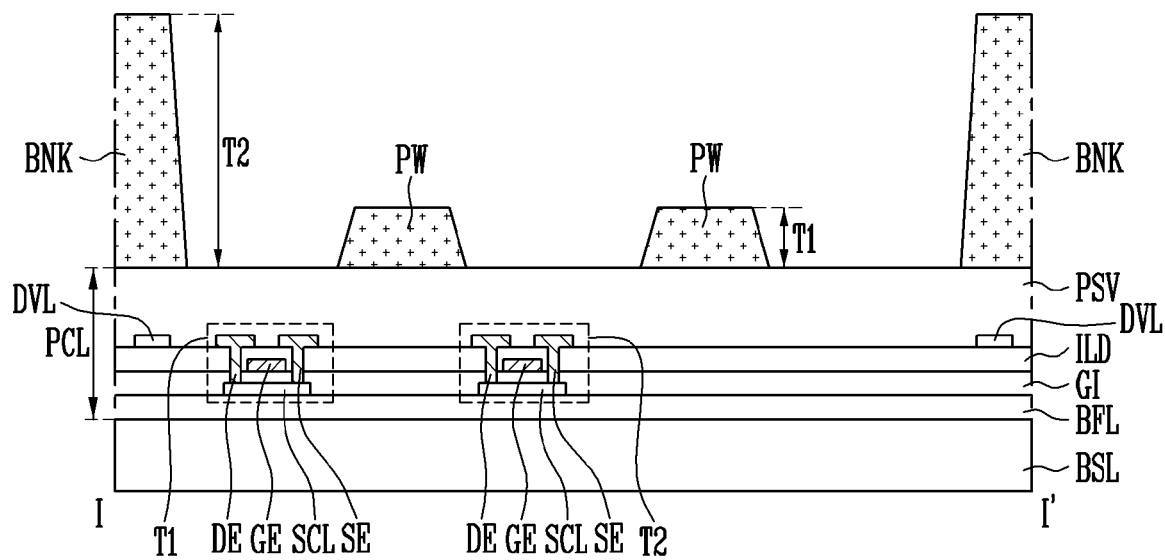

Referring to FIGS. 4A, 5, and 8B the partition wall PW and the bank BNK are formed on the pixel circuit layer PCL. The partition wall PW and the bank BNK may be formed by applying an insulating material layer (not shown) to the passivation layer PSV and patterning the insulating material layer. The partition wall PW may be formed or disposed on the passivation layer PSV in the emission area EMA of each of the first to third sub-pixels SP1 to SP3. The bank BNK may be formed or disposed in the non-emission area PPA between the adjacent sub-pixels SP1 to SP3.

The partition wall PW and the bank BNK may be formed of the same material or similar material through a process using a single mask. The partition wall PW and the bank BNK may be formed with different thicknesses by using a halftone mask or the like within the spirit and the scope of the disclosure.

Furthermore, the partition wall PW and the bank BNK may be successively formed using different masks.

Figure 8C:
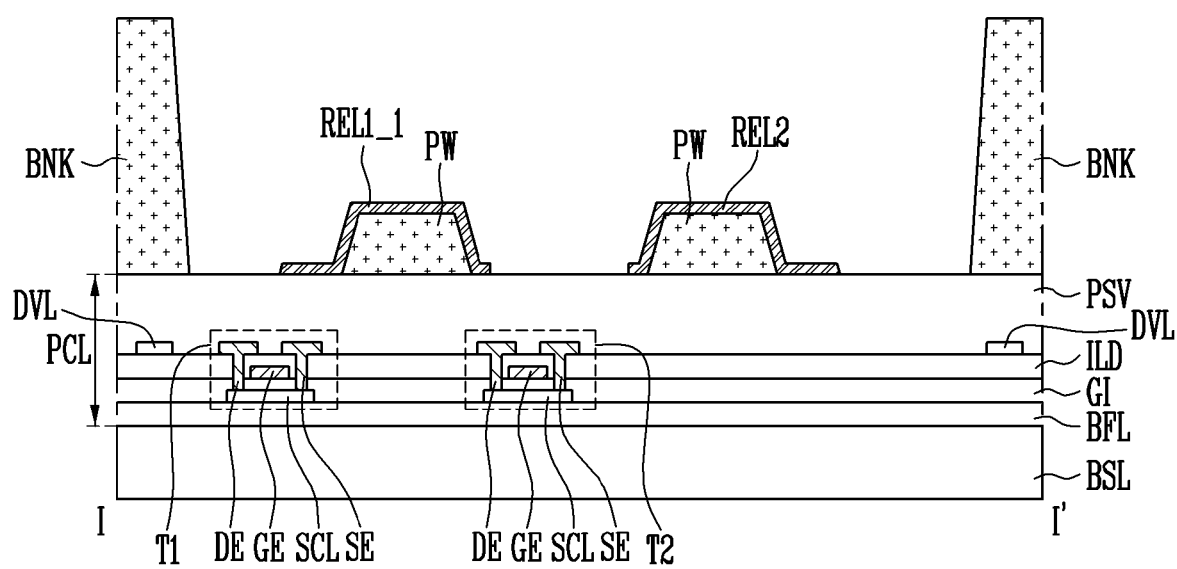

Referring to FIGS. 4A, 5, and 8C, the first and second electrodes REL1 and REL2 and the first and second connection lines CNL1 and CNL2 may be formed or disposed on the passivation layer PSV of each sub-pixel including the partition wall PW and the bank BNK. The first and second electrodes REL1 and REL2 and the first and second connection lines CNL1 and CNL2 may be formed by patterning conductive material having a high reflectivity.

Each of the first and second electrodes REL1 and REL2 may be provided or disposed and/or formed on a corresponding partition wall PW in the emission area EMA of each sub-pixel. Each of the first and second connection lines CNL1 and CNL2 may be provided or disposed and/or formed on the non-emission area PPA of each sub-pixel.

Although not illustrated, the first connection line CNL1 may be electrically connected or coupled to the first transistor T1 of the pixel circuit layer PCL through the first contact hole CH1 of the passivation layer PSV. The first connection line CNL1 may be provided integrally with the first electrode REL1 and electrically and/or physically coupled to the first electrode REL1 Hence, a signal (or a voltage) applied to the first transistor T1 may be transmitted to the first electrode REL1 through the first connection line CNL1.

Although not illustrated, the second connection line CNL2 may be electrically connected or coupled to the driving voltage line DVL of the pixel circuit layer PCL through the second contact hole CH2 of the passivation layer PSV. The second connection line CNL2 may be provided integrally with the second electrode REL2 and electrically and/or physically coupled to the second electrode REL2. Consequently, the voltage of the second driving power supply VSS of the driving voltage line DVL may be transmitted to the second electrode REL2 through the second connection line CNL2.

Figure 8D:
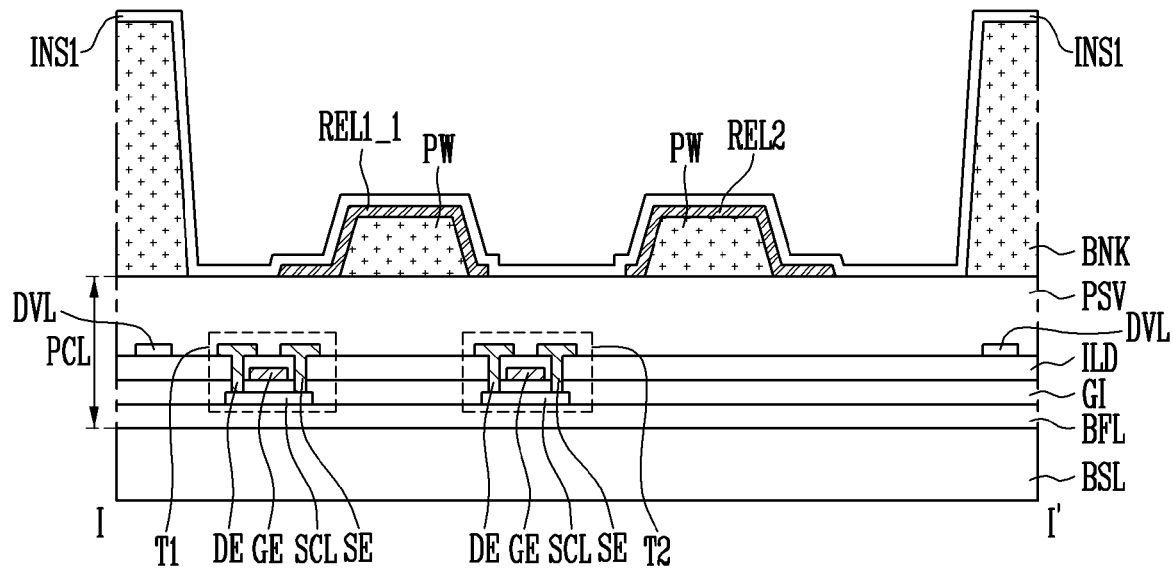

Referring to FIGS. 4A, 5, and 8D, the first insulating layer INS1 may be formed on the first and second electrodes REL1 and REL2 and the first and second connection lines CNL1 and CNL2. The first insulating layer INS1 may be formed or disposed between the first electrode REL1 and the second electrode REL2 in the emission area EMA of each sub-pixel. The first insulating layer INS1 may be formed or disposed to extend to an area in which the first insulating layer INS1 overlaps the bank BNK.

Figure 8E:
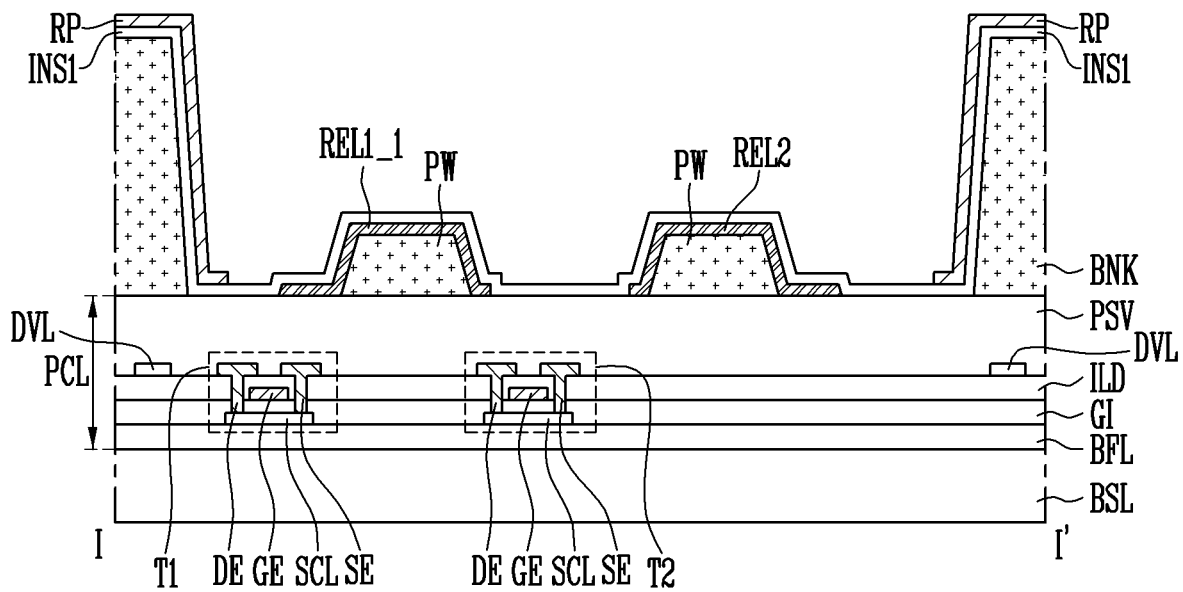

Referring to FIGS. 4A, 5, and 8E, the reflective pattern RP may be formed or disposed on the bank BNK. Here, the first insulating layer INS1 may be disposed between the reflective pattern RP and the bank BNK. The reflective pattern RP may be formed by patterning conductive material having a predetermined reflectivity. Metal, for example, Ag, Mg, Al, Pt, Pd, Au, Ni, Nd, Ir, Cr, T1, and an alloy thereof may be used as the conductive material.

The reflective pattern RP may function to reflect light traveling toward the bank BNK among light emitted from the sub-pixels SP1, SP2, and SP3, toward an upper portion of the base layer BSL.

Figure 8F:
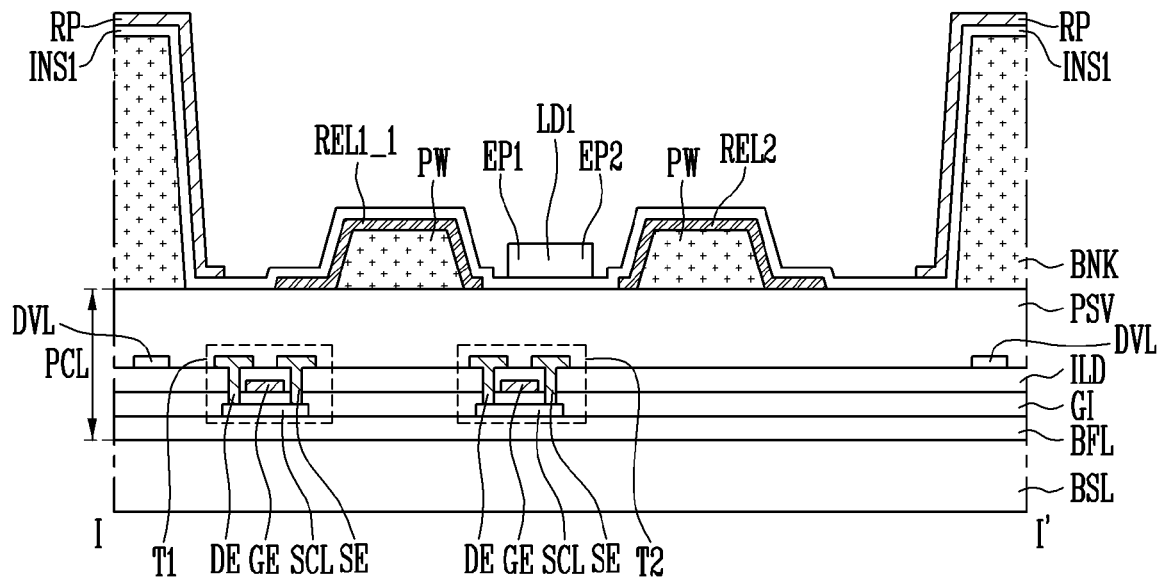

Referring to FIGS. 4A, 5, and 8F, an electric field is formed between the first electrode REL1 and the second electrode REL2 by respectively applying corresponding alignment voltages to the first and second electrodes REL1 and REL2 of each sub-pixel through the first and second connection lines CNL1 and CNL2. Where direct current power or alternating current power having predetermined voltage and period is repeatedly applied several times to each of the first and second electrodes REL1 and REL2 through the first and second connection lines CNL1 and CNL2, an electric field may be formed between the first and second electrodes REL1 and REL2 by a difference in potential between the first and second electrodes REL1 and REL2.

After an electric field is formed between the first electrode REL1 and the second electrode REL2 that are formed in the emission area EMA of each sub-pixel, light emitting elements LD are supplied in an inkjet printing scheme or the like within the spirit and the scope of the disclosure. For example, the light emitting elements LD may be supplied onto the passivation layer PSV of the emission area EMA of such sub-pixel by disposing a nozzle over the passivation layer PSV and dropping a solvent including the light emitting elements LD onto the passivation layer PSV through the nozzle. The solvent may be any one of acetone, water, alcohol, and toluene, but the disclosure is not limited thereto. For example, the solvent may include a material which may be vaporized at the room temperature or by heat. Furthermore, the solvent may have the form of ink or paste. A method of supplying the light emitting elements LD is not limited to the foregoing method. The method of supplying the light emitting elements LD may be changed. Subsequently, the solvent may be removed.

In the case where the light emitting elements LD are input onto the passivation layer PSV, self-alignment of the light emitting elements LD is induced by the electric field formed between the first electrode REL1 and the second electrode REL2, so that the light emitting elements LD can be aligned between the first electrode REL1 and the second electrode REL2. In other words, the light emitting elements LD may be intensively aligned in a target area, for example, the emission area EMA of each sub-pixel.

Figure 8G:
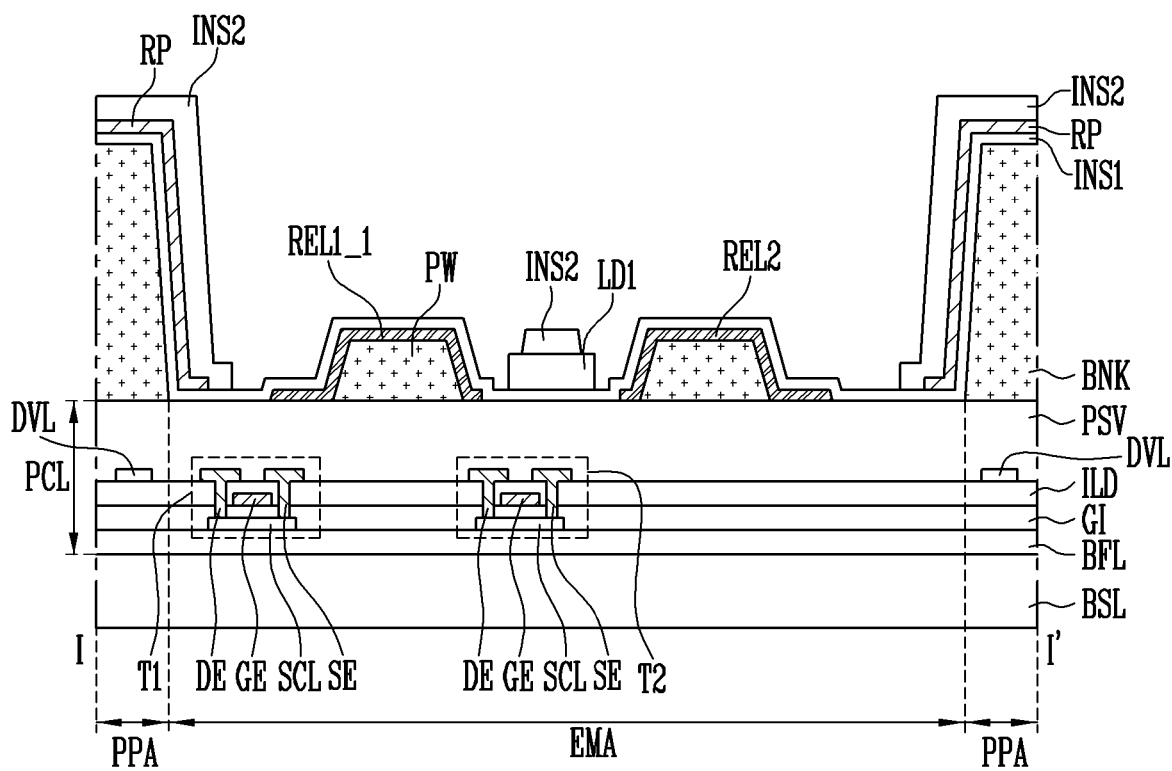

Referring to FIGS. 4A, 5, and 8G, after the alignment of the light emitting elements LD, the second insulating layer INS2 that covers or overlaps a portion of the upper surface of each light emitting element LD is formed by applying an insulating material layer (not illustrated) onto the passivation layer PSV and patterning the insulating material layer using a mask (not illustrated). Hence, the opposite ends EP1 and EP2 of each of the light emitting elements LD may be exposed to the outside.

Here, the second insulating layer INS2 may be formed to completely enclose the reflective pattern RP. The reason for this is to prevent the reflective pattern RP from being electrically connected with the first and second contact electrodes CNE1 and CNE2 to be described below.

Figure 8H:
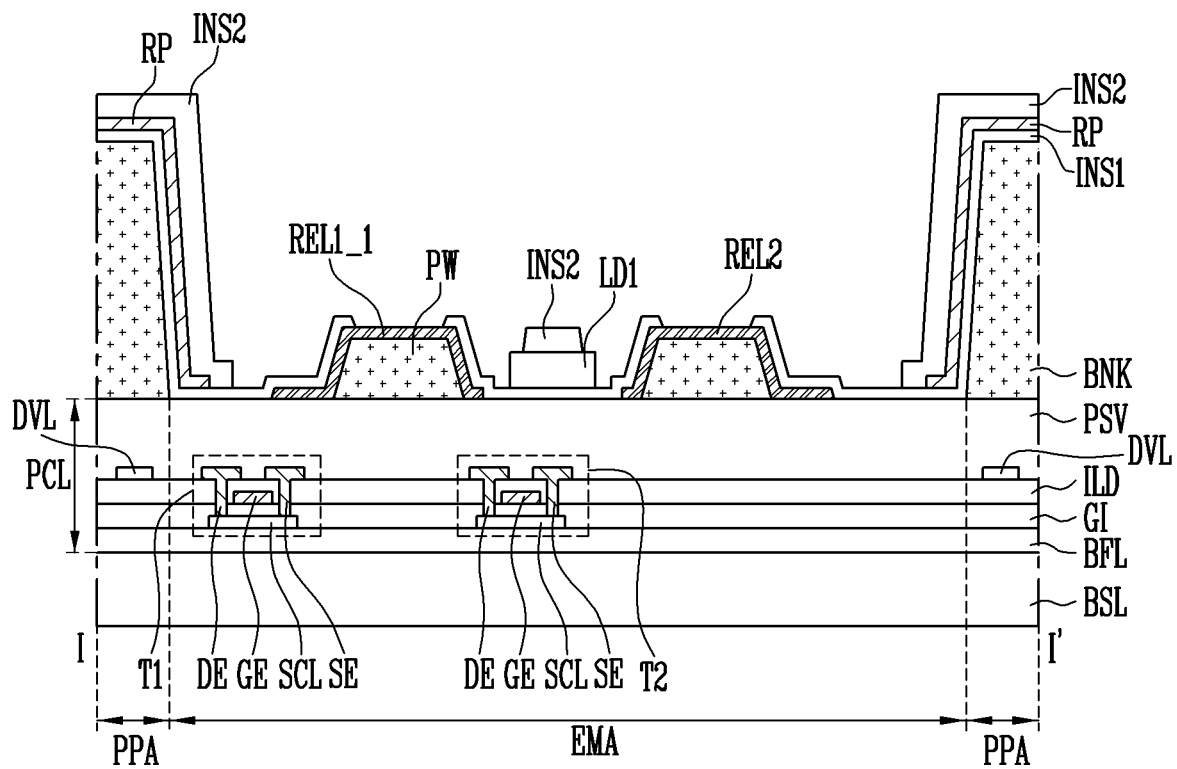

Referring to FIGS. 4A, 5, 8H, portions of the first electrode REL1 and the second electrode REL2 may be exposed by removing a portion of the first insulating layer INS1.

Figure 8I:
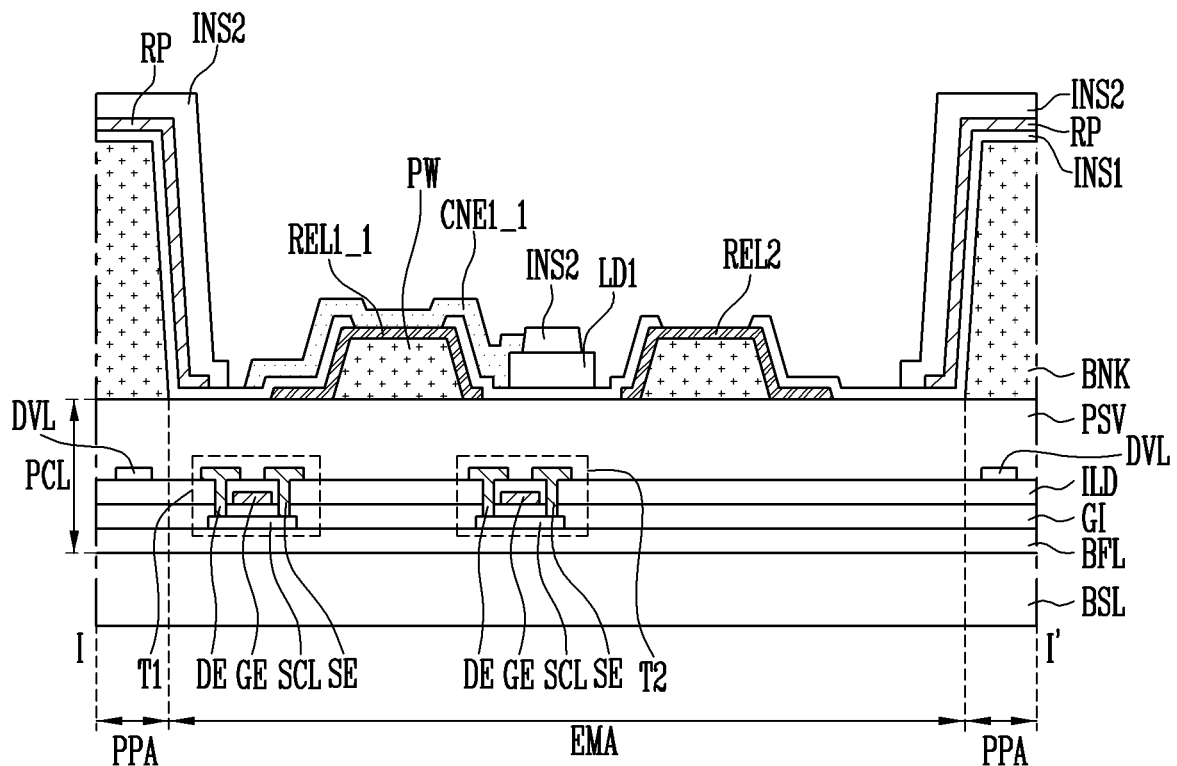

Thereafter, referring to FIGS. 4A, 5, and 8I, the first contact electrode CNE1 to be electrically connected or coupled with the exposed first electrode REL1 is formed. The first contact electrode CNE1 may electrically connect or couple the first electrode REL1 with one of the opposite ends EP1 and EP2 of each of the light emitting elements LD. Therefore, a signal of the first transistor T1 applied to the first electrode REL1, for example, the voltage of the first driving power supply VDD, may be transmitted to each of the light emitting elements LD through the first contact electrode CNE1.

The first contact electrode CNE1 may be formed of a transparent conductive material to allow light emitted from each of the light emitting elements LD and reflected by the first electrode REL1 in the frontal direction of the display device, for example, in the direction in which an image is displayed, to travel in the frontal direction without loss.

Here, the first contact electrode CNE1 may include a 1-1-th contact electrode CNE1_1 provided or disposed on the 1-1-th electrode REL1_1, and a 1-2-th contact electrode CNE1_2 provided or disposed on the 1-2-th electrode REL1_2.

Figure 8J:
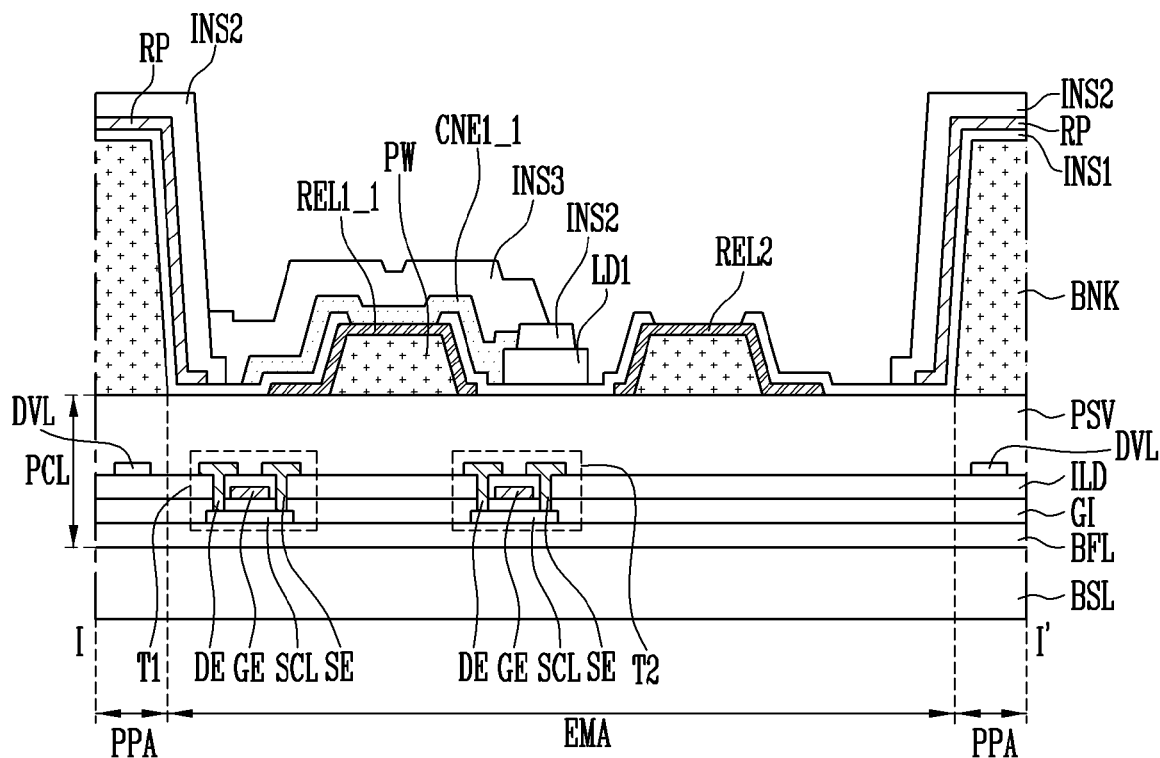

Referring to FIGS. 4A, 5, and 8J, the third insulating layer INS3 may be formed to cover or overlap the first contact electrode CNE1. The third insulating layer INS3 may prevent the first contact electrode CNE1 from being exposed to the outside, thus preventing the first contact electrode CNE1 from being corroded.

Figure 8K:
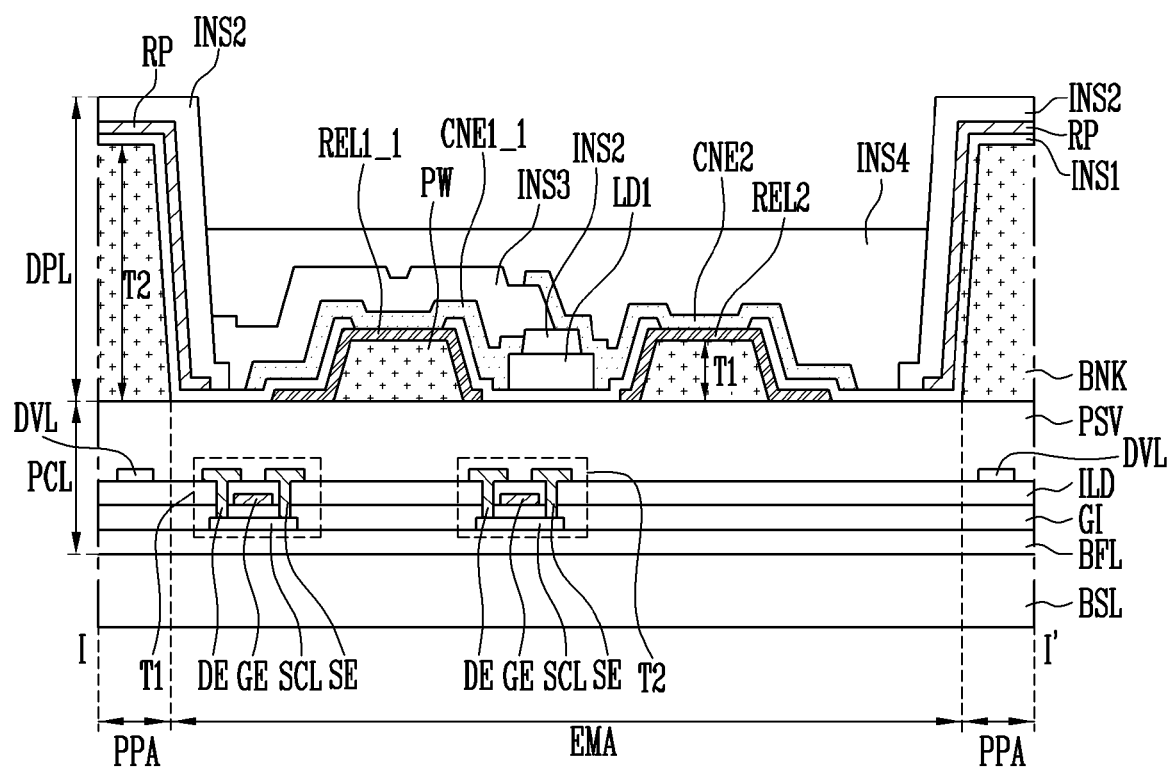

Referring to FIGS. 4A, 5, and 8K, the second contact electrode CNE2 to be electrically connected or coupled with the exposed second electrode REL2 is formed. The second contact electrode CNE2 may electrically connect or couple the second electrode REL2 with the other end of the opposite ends EP1 and EP2 of each of the light emitting elements LD, the other end being not electrically connected or coupled with the first contact electrode CNE1. Hence, the voltage of the second driving power supply VSS applied to the second electrode REL2 may be transmitted to each of the light emitting elements LD.

The second contact electrode CNE2 may be formed of a transparent conductive material to allow light emitted from each of the light emitting elements LD and reflected by the second electrode REL2 in the frontal direction of the display device to travel in the frontal direction without loss.

The fourth insulating layer INS4 for covering or overlapping the second contact electrode CNE2 may be formed or disposed on the second contact electrode CNE2. The fourth insulating layer INS4 may prevent the second contact electrode CNE2 from being exposed to the outside, thus preventing the second contact electrode CNE2 from being corroded. Here, the fourth insulating layer INS4 may be formed of an organic insulating layer, so that the fourth insulating layer INS4 may mitigate a step difference caused by the partition wall PW, the first and second electrodes REL1 and REL2, the first and second contact electrodes CNE1 and CNE2, for example.

The number of masks needed to manufacture the display device may be reduced by forming the first and second contact electrodes CNE1 and CNE2 on the same layer.

Hereinafter, a display device in accordance with an embodiment in which the first and second contact electrodes CNE1 and CNE2 are formed on the same layer will be described in detail with reference to the attached drawings.

Figure 9A:
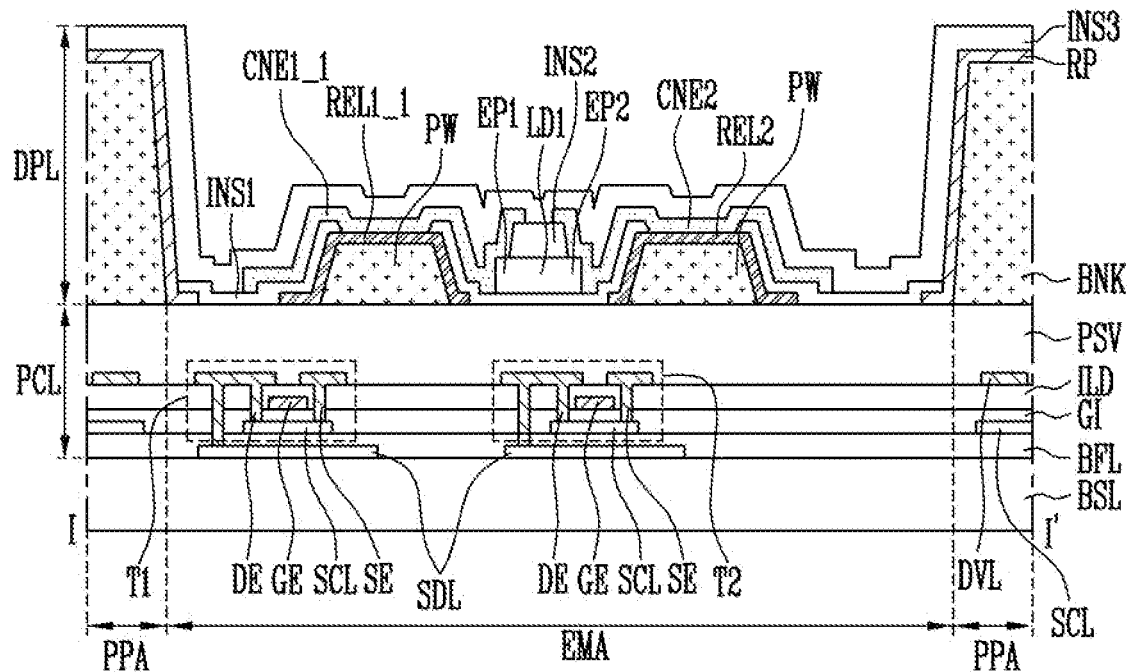
FIGS. 9A and 9B are sectional views illustrating a display device in accordance with an embodiment and are sectional views corresponding to line I-I' of FIG. 4A.
Figure 9B:
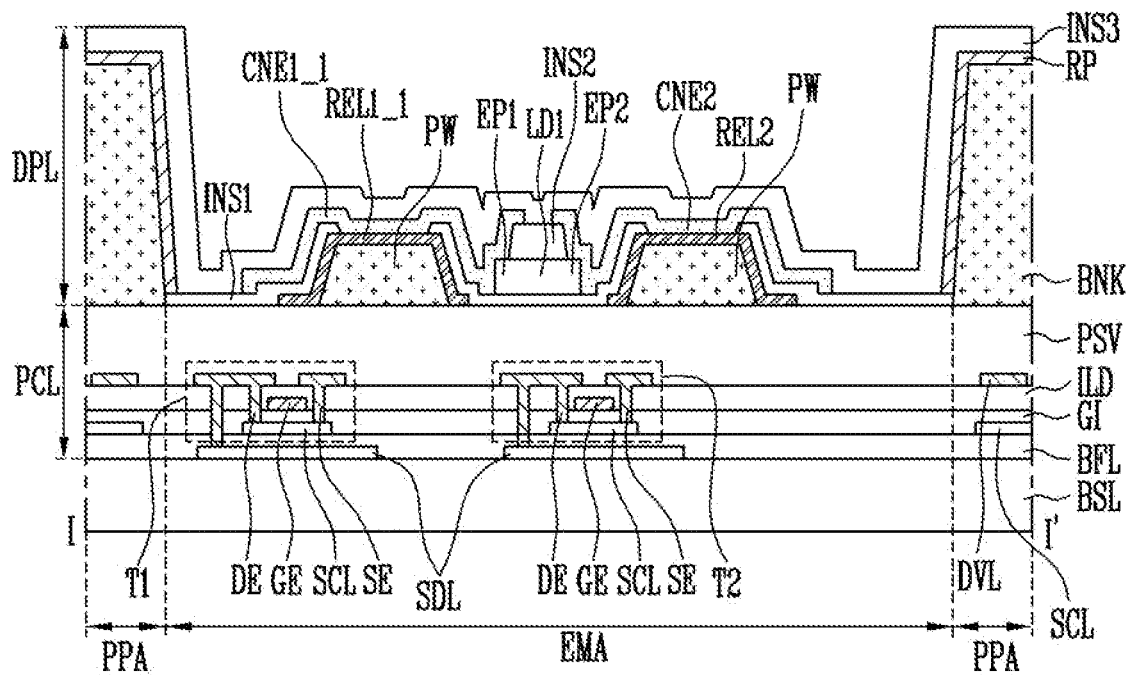

FIGS. 9A and 9B are sectional views illustrating a display device in accordance with an embodiment and are sectional views corresponding to line I-I' of FIG. 4A.

Referring to FIGS. 1, 4A, 9A, and 9B, the display device in accordance with an embodiment may include a base layer BSL on which a plurality of pixels PXL may be provided or disposed.

Each of the pixels PXL may include a first sub-pixel SP1, a second sub-pixel SP2, and a third sub-pixel SP3 which may be provided or disposed on the base layer BSL. Each of the first to third sub-pixels SP1 to SP3 may include an emission area EMA to emit light, and a non-emission area PPA disposed around a perimeter of the emission area EMA.

Each of the first to third sub-pixels SP1 to SP3 may include a base layer BSL, a pixel circuit layer PCL, and a display element layer DPL.

The pixel circuit layer PCL may include a buffer layer BFL disposed on the base layer BSL, first and second transistors T1 and T2 disposed on the buffer layer BFL, and a driving voltage line DVL. Furthermore, the pixel circuit layer PCL of each of the first to third sub-pixels SP1 to SP3 may further include a passivation layer PSV disposed on the first and second transistors T1 and T2 and the driving voltage line DVL.

A light shielding pattern SDL may be further provided or disposed between the base layer BSL and the buffer layer BFL. The light shielding pattern SDL may be a light shielding layer which may be formed of conductive material, insulating material, for example, and blocks light drawn into a rear surface of the base layer BSL so as to block the light from being drawn into the pixel circuit layer PCL of each of the first to third sub-pixels SP1 to SP3.

The light shielding pattern SDL may include Cr, a double layer including Cr or CrOx, resin including carbon pigment, black dye, graphite, or the like within the spirit and the scope of the disclosure. Where the light shielding pattern SDL is formed of resin including carbon pigment, the carbon pigment may be carbon black which is black pigment having a light shielding function.

The light shielding pattern SDL may be provided or disposed on the base layer BSL to correspond to a lower portion of the semiconductor layer SCL of each of the first and second transistors T1 and T2. The light shielding pattern SDL may be formed of metal which is a conductive material. The light shielding pattern SDL may be electrically connected or coupled to some or a number of components of any one transistor of the first and second transistors T1 and T2. Although in the drawings the light shielding pattern SDL is illustrated as being electrically connected or coupled with the drain electrode DE of the first transistor T1, the disclosure is not limited thereto.

The display element layer DPL may include a partition wall PW, a bank BNK, first and second electrodes REL1 and REL2, first and second connection lines CNL1 and CNL2, a plurality of light emitting elements LD, first and second contact electrodes CNE1 and CNE2.

The partition wall PW and the bank BNK may be formed or disposed on the passivation layer PSV and be formed on the same layer, as illustrated in the drawings. The partition wall PW may be formed and/or provided or disposed in the emission area EMA of each sub-pixel. The bank BNK may be formed and/or provided or disposed in the non-emission area PPA of each sub-pixel.

The reflective pattern RP disposed on the bank BNK may be provided or disposed on the same layer as that of the first and second electrodes REL1 and REL2, or disposed on a layer different from that of the first and second electrodes REL1 and REL2.

For example, as illustrated in FIG. 9A, the reflective pattern RP may include the same material or similar material provided or disposed on the same layer as that of the first and second electrodes REL1 and REL2. The first insulating layer INS1 may be disposed to cover or overlap the reflective pattern RP and the first and second electrodes REL1 and REL2. A plurality of light emitting elements LD may be disposed on the first insulating layer INS1.

The second insulating layer INS2 may be disposed to cover or overlap portions of the upper surfaces of the light emitting elements LD such that the opposite ends of each of the light emitting elements LD may be exposed.

The first contact electrode CNE1 and the second contact electrode CNE2 may be respectively electrically connected or coupled to the first electrode REL1 and the second electrode REL2 that may be exposed from the first insulating layer INS1. For example, the first contact electrode CNE1 may electrically connect or couple the first end of the light emitting element LD with the first electrode REL1 The second contact electrode CNE2 may electrically connect or couple the second end of the light emitting element LD with the second electrode REL2.

The first contact electrode CNE1 and the second contact electrode CNE2 may be provided or disposed on the same plane. The first contact electrode CNE1 and the second contact electrode CNE2 may be spaced apart from each other by a predetermined distance on the second insulating layer INS2 and thus electrically and/or physically separated from each other. In other words, the first contact electrode CNE1 and the second contact electrode CNE2 may be provided or disposed on the same layer and formed through the same manufacturing process.

The third insulating layer INS3 for covering or overlapping the first contact electrode CNE1 and the second contact electrode CNE2 may be provided or disposed on the first contact electrode CNE1 and the second contact electrode CNE2. The third insulating layer INS3 may prevent the first contact electrode CNE1 and the second contact electrode CNE2 from being exposed to the outside, thus preventing the first contact electrode CNE1 and the second contact electrode CNE2 from being corroded.

Although not illustrated, the fourth insulating layer INS4 for planarization of the display element layer DPL may be further disposed on the third insulating layer INS3.

As illustrated in FIG. 9B, the reflective pattern RP and the first and second electrodes REL1 and REL2 may be disposed on different layers. For example, the first and second electrodes REL1 and REL2 may be disposed under or below the first insulating layer INS1, and the reflective pattern RP may be disposed over the first insulating layer INS1. Although the reflective pattern RP and the first and second electrodes REL1 and REL2 are disposed on different layers, the reflective pattern RP and the first and second electrodes REL1 and REL2 may include the same material or similar material.

Although FIGS. 9A and 9B illustrate that the partition wall PW and the bank BNK are formed on the same layer on the passivation layer PSV, the partition wall PW and the bank BNK may be formed on different layers with the first insulating layer INS1 interposed therebetween, as illustrated in FIGS. 6B and 6C.

Although embodiments have been disclosed, those skilled in the art will appreciate that the disclosure can be implemented in other forms or may be varied, without departing from the scope and spirit of the disclosure as disclosed in the accompanying claims. Therefore, it should be understood that the embodiments are only for illustrative purposes and do not limit the scope of the disclosure.

The invention claimed is:

1. A display device comprising:
    a base layer including a display area and a non-display area; and
    a plurality of pixels disposed in the display area, each of the plurality of pixels including a plurality of sub-pixels, wherein
    each of the plurality of sub-pixels comprises:
        a pixel circuit layer; and
        a display element layer disposed on the pixel circuit layer,
    each display element layer comprises:
        a partition wall disposed in each of the plurality of sub-pixels;
        a bank disposed between adjacent ones of the plurality of sub-pixels, the bank having a greater thickness than the partition wall;
        a first electrode and a second electrode disposed on the partition wall and spaced apart from each other;
        a reflective pattern disposed on the bank; and
        at least one light emitting element disposed between the first electrode and the second electrode wherein the reflective pattern encloses an upper surface and a side surface of the bank.

2. The display device according to claim 1, wherein the partition wall is disposed between the bank and the at least one light emitting element.

3. The display device according to claim 1, wherein the bank and the partition wall are disposed on a same layer and include a same material.

4. The display device according to claim 1, wherein the partition wall and the bank are disposed on different layers.

5. The display device according to claim 1, wherein
    the first electrode, the second electrode, and the reflective pattern are disposed on a same layer, and
    the first electrode and the second electrode include a same material.

6. The display device according to claim 1, wherein the first electrode and the second electrode are disposed on a different layer from a layer on which the reflective pattern is disposed.

7. The display device according to claim 1, wherein the pixel circuit layer comprises:
    at least one transistor disposed on the base layer; and
    a passivation layer disposed on the at least one transistor.

8. The display device according to claim 7, wherein the partition wall and the bank are formed integrally on the passivation layer.

9. The display device according to claim 1, wherein
    each of the plurality of sub-pixels comprises a light conversion pattern layer disposed in a space formed by the bank, and
    the light conversion pattern layer includes color conversion particles that convert received light into a predetermined color of light.

10. The display device according to claim 9, further comprising:
    a capping layer disposed on the light conversion pattern layer and overlapping the display area.

11. The display device according to claim 9, wherein the light conversion pattern layer comprises a color filter.

12. The display device according to claim 1, wherein
    the reflective pattern includes a metal, and
    the reflective pattern is thinner than the bank.

13. A method of manufacturing a display device, comprising:
    providing a base layer including a plurality of sub-pixels;
    forming a pixel circuit layer on the base layer; and
    forming a display element layer on the pixel circuit layer, wherein the forming of the display element layer comprises:
        forming a partition wall in each of the plurality of sub-pixels;
        forming a bank between adjacent ones of the plurality of sub-pixels;
        forming a first electrode and a second electrode spaced apart from each other and disposed on the partition wall;
        forming a reflective pattern on the bank; and
        forming at least one light emitting element disposed between the first electrode and the second electrode.

14. The method according to claim 13, wherein the forming of the reflective pattern comprises enclosing an upper surface and a side surface of the bank with the reflective pattern.

15. The method according to claim 13, wherein the partition wall and the bank are formed on a same layer through a same process.

16. The method according to claim 13, wherein the partition wall and the bank are formed on different layers through different processes.

17. The method according to claim 13, wherein the first electrode, the second electrode, and the reflective pattern are formed on a same layer through a same process.

18. The method according to claim 13, wherein the first electrode and the second electrode are formed on a different layer from a layer of the reflective pattern, and the first electrode and the second electrode are formed through a different process from a process of forming the reflective pattern.

19. The method according to claim 13, wherein the forming of the at least one light emitting element comprises aligning the at least one light emitting element between the first electrode and the second electrode by applying alignment voltages to the first electrode and the second electrode, respectively.

20. The method according to claim 13, further comprising:

forming a light conversion pattern layer in a space formed by the bank in each of the plurality of sub-pixels, the light conversion pattern layer including color conversion particles converting received light to a predetermined color of light.

\* \* \* \* \*